(12) United States Patent
Marchegiani

(10) Patent No.: US 12,272,562 B2
(45) Date of Patent: Apr. 8, 2025

(54) OXYGEN AND IODINE-CONTAINING HYDROFLUOROCARBON COMPOUND FOR ETCHING SEMICONDUCTOR STRUCTURES

(71) Applicant: American Air Liquide, Inc., Fremont, CA (US)

(72) Inventor: Fabrizio Marchegiani, Wilmington, DE (US)

(73) Assignee: L'Aire Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 457 days.

(21) Appl. No.: 17/555,094

(22) Filed: Dec. 17, 2021

(65) Prior Publication Data
US 2023/0197465 A1    Jun. 22, 2023

(51) Int. Cl.
H01L 21/311      (2006.01)
H01L 21/033      (2006.01)
H01L 21/32       (2006.01)

(52) U.S. Cl.
CPC ........ *H01L 21/31116* (2013.01); *H01L 21/32* (2013.01); *H01L 21/033* (2013.01)

(58) Field of Classification Search
None
See application file for complete search history.

(56) References Cited

U.S. PATENT DOCUMENTS

| 4,588,609 A | 5/1986 | Leyden et al. |
| 5,277,750 A | 1/1994 | Frank |
| 5,417,770 A | 5/1995 | Saitoh et al. |
| 5,445,712 A * | 8/1995 | Yanagida ........ H01L 21/31116 257/E21.252 |
| 6,410,102 B1 | 6/2002 | Hashizume et al. |

(Continued)

FOREIGN PATENT DOCUMENTS

| JP | 3 291 885 | 6/2002 |
| TW | 2017 34267 | 10/2017 |

(Continued)

OTHER PUBLICATIONS

Au, Y. et al., Filling narrow trenches by iodine-catalyzed CVD of copper and manganese on manganese nitride barrier-adhesion layers, Journal of The Electrochemical Society, 158 (5), 2011, D248-D253.

(Continued)

*Primary Examiner* — Stephanie P Duclair
(74) *Attorney, Agent, or Firm* — Yan Jiang

(57) ABSTRACT

A method comprises: introducing a vapor of an oxygen and iodine-containing etching compound into a chamber that contains a substrate having a silicon-containing film deposited thereon and a patterned mask layer deposited on the silicon-containing layer, wherein the oxygen and iodine-containing etching compound has the formula $C_nH_xF_yI_zO_e$, wherein $0 \leq n \leq 10$, $0 \leq x \leq 21$, $0 \leq y \leq 21$, $1 \leq z \leq 4$ and $1 \leq e \leq 2$; activating a plasma to produce an activated oxygen and iodine-containing etching compound; and allowing an etching reaction to proceed between the activated oxygen and iodine-containing etching compound and the silicon-containing film to selectively etch the silicon-containing film from the patterned mask layer, thereby forming a patterned structure.

20 Claims, 11 Drawing Sheets

(56) References Cited

U.S. PATENT DOCUMENTS

| | | | |
|---|---|---|---|
| 6,508,948 | B2 | 1/2003 | Felker et al. |
| 7,041,596 | B1 | 5/2006 | Dalton et al. |
| 9,659,788 | B2 | 5/2017 | Surla et al. |
| 10,074,534 | B2 | 9/2018 | Behera et al. |
| 10,331,033 | B2 | 6/2019 | Shin et al. |
| 10,410,878 | B2 | 9/2019 | Sun et al. |
| 2006/0140836 | A1 | 6/2006 | Oka |
| 2006/0140839 | A1 | 6/2006 | Oka |
| 2008/0283973 | A1 | 11/2008 | Oberbeck et al. |
| 2011/0059617 | A1 | 3/2011 | Mitchell et al. |
| 2011/0180941 | A1 | 7/2011 | Hwang et al. |
| 2014/0084219 | A1 | 3/2014 | Zhao et al. |
| 2017/0178923 | A1* | 6/2017 | Surla ............... H01L 21/31116 |
| 2017/0278709 | A1 | 9/2017 | Mebarki et al. |
| 2017/0342548 | A1 | 11/2017 | Shimizu et al. |
| 2019/0027368 | A1 | 1/2019 | Matsuura |
| 2019/0390340 | A1 | 12/2019 | Yu et al. |
| 2020/0006160 | A1 | 1/2020 | Lin et al. |
| 2020/0203174 | A1 | 6/2020 | Surla et al. |
| 2021/0285102 | A1 | 9/2021 | Yoon et al. |
| 2023/0352483 | A1 | 11/2023 | Yang et al. |

FOREIGN PATENT DOCUMENTS

| | | |
|---|---|---|
| TW | 2020 15182 | 4/2020 |
| TW | I703631 | 9/2020 |
| TW | 2021 41645 | 11/2021 |
| WO | WO 2009 019210 | 2/2009 |
| WO | WO 2009 019219 | 2/2009 |
| WO | WO 2021 146138 | 2/2009 |
| WO | WO 2019 002058 | 1/2019 |

OTHER PUBLICATIONS

Falaise, C. et al., Capture of iodine in highly stable metal-organic frameworks: a systematic study, Chem. Commun. 2013, 49, 10320-10322.

Grzeskowiak, S. et al., Cross sections of EUV PAGs: influence of concentration, electron energy, and structure, downloaded from http://proceedings.spiedgitallibrary.org/ on Jun. 14, 2016.

Huheey, J.E. et al., Inorganic chemistry: principles of structure and reactivity, $4^{th}$ ed., 1993, HarperCollins College Publishers, A25-A33.

Karecki, S.M. et al., Plasma etching of dielectric films with novel iodofluorocarbon chemistries: iodotrifluoroethylene and 1-iodoheptafluoropropane, Journal of Vacuum Science & Technology A 16, 755, 1998, 755-758.

Li, L. et al., Extreme ultraviolet resist materials for sub-7 nm patterning, Chem. Soc, Rev. 2017, 46, 4855-4866.

Yu, M. et al., Positive tone oxide nanoparticle EUV (ONE) photoresists, downloaded from http://proceedings.spiedgitallibrary.org/ on Mar. 29, 2016.

International Search Report and Written Opinion for PCT/US2002/052706, mailed Mar. 7, 2023.

International Search Report and Written Opinion for related PCT/US2022/052709, Mar. 28, 2023.

* cited by examiner

OXYGEN AND IODINE-CONTAINING HYDROFLUOROCARBON COMPOUND FOR ETCHING SEMICONDUCTOR STRUCTURES

TECHNICAL FIELD

The present invention is related to methods of etching a silicon-containing film to form a patterned structure, in particular, to the methods of using oxygen and iodine-containing compounds to etch the silicon-containing film over a patterned mask layer to form the patterned structure, wherein the oxygen and iodine-containing compounds have the formula $C_nH_xF_yI_zO_e$, wherein $0\leq n\leq 10$, $0\leq x\leq 21$, $0\leq y\leq 21$, $1\leq z\leq 4$ and $1\leq e\leq 2$, so that the patterned mask layer is reinforced, strengthened, or minimized damages by doping iodine from iodine ions produced from the activated oxygen and iodine-containing etching compound into the patterned mask layer.

BACKGROUND

In semiconductor industries, for 3D NAND, etching of stacks of multiple SiO/SiN or SiO/poly-Silicon (p-Si) layers is critical. See, e.g., US 2011/0180941 to Samsung Electronics Co., Ltd. An etchant having high selectivity between the mask and layers being etched is essential. Furthermore, the etched structure should have a straight vertical profile without bowing and low line etch roughness (LER).

Standard hydrofluorocarbon used to etch silicon oxide are $cC_4F_8$, $C_4F_6$ combined with an oxidizer (e.g., $O_2$) and a noble gas (e.g., Ar, Kr, Xe). For Silicon nitride etch usually the above listed gases are mixed with hydrogen containing fluorocarbons, such as $CHF_2$, $CHF_3$, $CH_3F$, or the like.

However, traditional etch chemistries may not be able to provide a feature, such as a hole or trench, having an aspect ratio higher than 20:1, which is necessary in the newer applications (e.g., 3D NAND), at least due to insufficient etch resistant polymer deposition on sidewalls during the plasma etching processes. The sidewall —$C_xF_y$-polymers, wherein x ranges from 0.01 to 1 and y ranges from 0.01 to 4, may be susceptible to etching. As a result, the etched patterns may not be vertical and the etch structures may show bowing, change in dimensions, pattern collapse and/or increased roughness.

Bowing may result from sidewall etching of the mask layer, which may often be an amorphous carbon (a-C) material. The a-C materials may be etched by oxygen radicals in the plasma which may cause increased opening of the mask and result in bow-like, or angled/curved, etch structures.

Carbonyl-containing compounds have been used as etching gases for etch back and/or decomposition of the carbonyl-containing compounds has been disclosed. JP3291885 B2 to Y. Toshiharu discloses a dry etching method in which a connecting hole is buried with good flatness by etching back a blanket CVD tungsten layer using carbonyl fluoride compound gases, such as $COF_2$, COFCl, COFBr, COFI and $(COF)_2$. Furthermore, F-based gases, such as $SF_6$, $NF_3$, $CF_4$, $ClF_3$, $XeF_2$, $F_2$, etc. are used as general gases for F sources. US 2006/0140836 A1 to O. Masakazuifco discloses a process for decomposing fluorine compounds having iodine within the molecules and rendering them harmless. The fluorine compounds include compounds such as $C_2F_5IO$ and $C_2F_4I_2O$. WO 2009/019219 to Uenveren et al. discloses etching method of $SiO_2$ for self-aligned contact using hydrofluorocarbons. Although $C_3F_5IO$ is listed, Oxygen is a terminal oxygen attached to carbon and no any supporting etching examples are disclosed.

It is important to minimize bowing, CD variations (top versus bottom), twisting, incomplete etch, to maximize selectivity to hardmask and to achieve high aspect ratio (i.e., up to 200:1) needed for current applications (e.g., contact etch or 3D NAND). Additionally, etching today has not been limited to selectivity to the photoresist mask. It is equally important to get high selectivity among other materials such as a-C, SiN, p-Si, SiC or other forms of $Si_aC_bO_cH_dN_e$ materials (where $a>0$; b, c, d and $e\geq 0$).

Thus, a need remains for etch gas compositions suitable for use in plasma etching applications which maintain selectivity and high aspect ratios for a wide range of process conditions.

SUMMARY

There is disclosed a method for forming a patterned structure, the method comprising the steps of:
a) introducing a vapor of an oxygen and iodine-containing etching compound into a reaction chamber that contains a substrate, the substrate having a silicon-containing film deposited thereon and a patterned mask layer deposited on the silicon-containing layer, wherein the oxygen and iodine-containing etching compound has the formula $C_nH_xF_yI_zO_e$, wherein $0\leq n\leq 10$, $0\leq x\leq 21$, $0\leq y\leq 21$, $1\leq z\leq 4$ and $1\leq e\leq 2$;
b) activating a plasma to produce an activated oxygen and iodine-containing etching compound; and
c) allowing an etching reaction to proceed between the activated oxygen and iodine-containing etching compound and the silicon-containing film to selectively etch the silicon-containing film from the patterned mask layer, thereby forming the patterned structure. The disclosed methods may include one or more of the following aspects:
the step c) comprising the step of: modifying the patterned mask layer or doping iodine from iodine ions produced from the activated oxygen and iodine-containing etching compound into the patterned mask layer;
the step c) comprising the step of: modifying the patterned mask layer:
the step c) comprising the step of: doping iodine from iodine ions produced from the activated oxygen and iodine-containing etching compound into the patterned mask layer;
the step c) comprising the step of: reinforcing the patterned mask layer or doping iodine from iodine ions produced from the activated oxygen and iodine-containing etching compound into the patterned mask layer;
the step c) comprising the step of: strengthening the patterned mask layer or doping iodine from iodine ions produced from the activated oxygen and iodine-containing etching compound into the patterned mask layer;
the step c) comprising the step of: minimizing damage of the patterned mask layer or doping iodine from iodine ions produced from the activated oxygen and iodine-containing etching compound into the patterned mask layer;
the step c) comprising the step of: increasing etch resistance of the patterned mask layer or doping iodine from iodine ions produced from the activated oxygen and iodine-containing etching compound into the patterned mask layer:

the step c) comprising the step of: increasing the etch selectivity towards the underlying layer of the substrate while forming the patterned structure in the substrate;

further comprising the step of introducing an inert gas into the reaction chamber;

the inert gas being selected from the group consisting of He, Ar, Xe, Kr, Ne and $N_2$;

the inert gas being Ar;

mixing the oxygen and iodine-containing etching compound and the inert gas prior to introduction to the chamber to produce a mixture;

introducing the oxygen and iodine-containing etching compound separately from the inert gas;

introducing the inert gas continuously and introducing the oxygen and iodine-containing etching compound in pulses;

the inert gas comprising approximately 0.01% v/v to approximately 99.9% v/v of a total volume of the vapor of the oxygen and iodine-containing etching compound and inert gas;

the inert gas comprising approximately 90% v/v to approximately 99% v/v of a total volume of the vapor of the oxygen and iodine-containing etching compound and inert gas;

further optionally comprising the step of introducing an oxidizer into the reaction chamber;

the oxidizer being selected from $O_2$, $O_3$, CO, $CO_2$, NO, $N_2O$, $NO_2$, $H_2O$, $H_2O_2$, COS, $SO_2$ and combinations thereof;

the oxidizer being $O_2$;

the oxidizer being $O_3$;

mixing the oxygen and iodine-containing etching compound and the oxygen containing gas prior to introduction to the chamber to produce a mixture;

introducing the oxygen and iodine-containing etching compound separately from the oxygen containing gas;

introducing the oxygen containing gas continuously and introducing the oxygen and iodine-containing etching compound;

the oxygen containing gas comprising approximately 0.01% v/v to approximately 99.9% v/v of a total volume of the oxygen and iodine-containing etching compound and oxygen containing gas;

oxygen containing gas comprising approximately 0.01% v/v to approximately 10% v/v of a total volume of the oxygen and iodine-containing etching compound and oxygen containing gas;

the oxygen and iodine-containing etching compound being a hydrofluorocarbon compound;

the oxygen and iodine-containing etching compound being an oxygen and iodine-containing hydrofluorocarbon;

the oxygen and iodine-containing etching compound being an organofluorine compound;

the oxygen and iodine-containing etching compound being a fluorine-containing hydrocarbon compound;

the oxygen and iodine-containing etching compound being a fluorocarbon compound;

the oxygen and iodine-containing etching compound containing no hydrogen;

the oxygen and iodine-containing etching compound containing hydrogen;

the oxygen and iodine-containing etching compound containing fluorine;

the oxygen and iodine-containing etching compound containing no fluorine;

the oxygen and iodine-containing etching compound being $C_3F_7IO$ and its isomers;

the oxygen and iodine-containing etching compound being $C_3F_7IO$, 2-Iodo-1-(trifluoromethoxy)tetrafluoroethane (CAS No.: 1561-52-0);

the oxygen and iodine-containing etching compound being $C_3F_7IO$, 1,1,1,2-tetrafluoro-2-iodo-2-(trifluoromethoxy)ethane (CAS No.: 139604-89-0);

the oxygen and iodine-containing etching compound being $C_3F_7IO$, 1,2,2,2-tetrafluoro-1-trifluoromethoxy-1-iodoethane (CAS No.: 69066-98-4);

the oxygen and iodine-containing etching compound being $C_3F_7IO$, 1,1,1,2,2,3,3-heptafluoro-3-iodosyl-propane (CAS No.: 180613-10-9);

the oxygen and iodine-containing etching compound being $C_3F_6I_2O$, $C_3F_5I_3O$, $C_3F_4I_4O$ and their isomers;

the oxygen and iodine-containing etching compound being $C_3F_7IO$, $C_3F_6I_2O$, $C_3F_5I_3O$, $C_3F_4I_4O$, $C_4F_9IO$, $C_4F_8I_2O$, $C_4F_7I_3O$, $C_4F_6I_4O$, $C_5F_{11}IO$, $C_5F_{10}I_2O$, $C_5F_9I_3O$, $C_5F_8I_4O$, $C_6F_{13}IO$, $C_6F_{12}I_2O$, $C_6F_{11}I_3O$, $C_6F_{10}I_4O$, $C_7F_{15}IO$, $C_7F_{14}I_2O$, $C_7F_{13}I_3O$, $C_7F_{12}I_4O$, $C_8F_{17}IO$, $C_8F_{16}I_2O$, $C_8F_{15}I_3O$, $C_8F_{14}I_4O$, $C_9F_{19}IO$, $C_9F_{18}I_2O$, $C_9F_{17}I_3O$, $C_8F_{16}I_4O$, $C_{10}F_{21}IO$, $C_{10}F_{20}I_2O$, $C_{10}F_{19}I_3O$, $C_{10}F_{18}I_4O$ and their isomers;

the oxygen and iodine-containing etching compound being $C_4F_9IO$, $C_4F_9IO$, $C_5F_{11}IO$, $C_5F_{11}IO$, $C_6F_{13}IO$, $C_7F_{15}IO$, $C_8F_{17}IO$, $C_9F_{19}IO$, $C_{10}F_{21}IO$, and theirs isomers;

the oxygen and iodine-containing etching compound being $C_3HF_6IO$, $C_3HF_5I_2O$, $C_3HF_4I_3O$, $C_3HF_3I_4O$, $C_4HF_8IO$, $C_4HF_7I_2O$, $C_4HF_6I_3O$, $C_4HF_5I_4O$, $C_5HF_{10}IO$, $C_5HF_9I_2O$, $C_5HF_8I_3O$, $C_5HF_7I_4O$, $C_6HF_{12}IO$, $C_6HF_{11}I_2O$, $C_6HF_9I_3O$, $C_6HF_8I_4O$, $C_7HF_{14}IO$, $C_7HF_{13}I_2O$, $C_7HF_{12}I_3O$, $C_7HF_{11}I_4O$, $C_6HF_{16}IO$, $C_8HF_{15}I_2O$, $C_8HF_{14}I_3O$, $C_8HF_{10}I_4O$, $C_9HF_{18}IO$, $C_9HF_{17}I_2O$, $C_9HF_{16}I_3O$, $C_9HF_{15}I_4O$, $C_{10}HF_{20}IO$, $C_{10}HF_{19}I_2O$, $C_{10}HF_{18}I_3O$, $C_{10}HF_{17}I_4O$ and their isomers;

the plasma activated the oxygen and iodine-containing etching compound reacting with the silicon-containing film to form volatile by-products;

the volatile by-products being removed from the reaction chamber;

the silicon-containing film comprising oxygen, nitrogen, carbon, hydrogen, carbon or combinations thereof;

the silicon-containing film optionally containing dopants such as B, C, P, As Ga, In, Sn, Sb, Bi and/or Ge, or combinations thereof;

the silicon-containing film comprising a layer of silicon oxide (SiO), silicon nitride (SiN), crystalline Si, polysilicon (p-Si), polycrystalline silicon, amorphous silicon, low-k SiCOH, SiOCN, SiC, SiON, $Si_aO_bH_cC_dN_e$, where a>0; b, c, d and e≥0, alternating SiO and SiN (ONON) layers, or alternating SiO and p-Si (OPOP) layers;

the silicon-containing film being $SO_xN_yH_zC_k$, wherein x ranges from 0 to 2, y ranges from 0 to 4, z ranges from 0 to about 1 and k ranges from 0 to 1;

the silicon-containing film comprising a SiO layer;

the silicon-containing film being a SiN layer;

the silicon-containing film comprising alternating SiO and SiN (ONON) layers;

the silicon-containing film comprising alternating SiO and p-Si (OPOP) layers;

the patterned mask layer being an amorphous carbon layer, a doped amorphous carbon layer, a photoresist layer, an anti-reflective layer, an organic planarization layer or combinations thereof;

the patterned mask layer being a layer of CVD, PECVD, ALD, PEALD or spin on deposited (SOD) amorphous carbon or doped amorphous carbon, silicon-containing spin on mask, or carbon-containing spin on mask;

the patterned mask layer being an amorphous carbon (a-C) layer:

the patterned mask layer being a doped carbon layer;

the doped amorphous carbon layer being a boron-doped a-C layer;

the doped amorphous carbon layer being a tungsten-doped a-C layer;

the alternating layers being selectively etched from the patterned mask layer;

the alternating layers being selectively etched from an a-C layer;

the alternating layers being selectively etched from a doped carbon layer;

the alternating layers of silicon oxide and silicon nitride being selectively etched from an a-C layer;

the alternating layers of silicon oxide and silicon nitride being selectively etched from a doped carbon layer;

the alternating layers of silicon oxide and polysilicon being selectively etched from an a-C layer;

the alternating layers of silicon oxide and polysilicon being selectively etched from a doped carbon layer;

the silicon oxide layer being selectively etched from the patterned mask layer;

the silicon oxide layer being selectively etched from an a-C layer;

the silicon oxide layer being selectively etched from a doped carbon layer;

the silicon nitride layer being selectively etched from the patterned mask layer, the silicon nitride layer being selectively etched from an a-C layer;

the silicon nitride layer being selectively etched from a doped carbon layer;

the polysilicon layer being selectively etched from the patterned mask layer;

the polysilicon layer being selectively etched from an a-C layer;

the polysilicon layer being selectively etched from a doped carbon layer;

the silicon-containing film being selectively etched from an a-C layer, a doped a-C layer, a photoresist layer, an anti-reflective layer or organic planarization layer;

the silicon oxide layer being selectively etched from an a-C layer, a doped a-C layer, a photoresist layer, an anti-reflective layer or organic planarization layer;

the oxygen and iodine-containing etching compound etching both the silicon oxide layer and the silicon nitride layer with high etch rates;

the oxygen and iodine-containing etching compound plasma etching the alternating SiO and SiN (ONON) layers having a selectivity between about 1:2 to about 2:1 with respect to the SiO layer versus SiN layer;

the oxygen and iodine-containing etching compound plasma etching the alternating SiO and SiN (ONON) layers having a selectivity of approximately 1:1 with respect to the SiO layer versus SiN layer;

the oxygen and iodine-containing etching compound plasma etching the alternating SiO and p-Si (OPOP) layers having a selectivity between about 1:2 to about 2:1 with respect to the SiO layer versus p-Si layer;

the oxygen and iodine-containing etching compound plasma etching the alternating SiO and p-Si (OPOP) layers having a selectivity of approximately 1:1 with respect to the SiO layer versus p-Si layer;

a selectivity of the oxygen and iodine-containing etching compound plasma etching $SiO_2$ over the patterned mask layer being approximately 70% higher than the selectivity of a benchmark gas $C_4F_6$ etching $SiO_2$ over the patterned mask layer with similar etch rates;

the patterned mask layer being a carbon-containing layer, an amorphous carbon layer, a doped amorphous carbon layer, a photoresist layer, an anti-reflective layer, an organic planarization layer, or combinations thereof;

the activated oxygen and iodine-containing etching compound selectively etching the silicon-containing film from a landing layer located at the bottom of the silicon-containing film to be etched;

the landing layer being a buried landing layer located at the bottom of the structure to be etched;

the landing layer being an etching stop layer;

the landing layer being a silicon layer;

the landing layer being a metal layer;

the landing layer being a tungsten metal word-line in a 3D NAND structure and/or another metal such as W, Cu, Al, Ru, Pt, Ti, Ta, Ni, Co, Mo, Mn, Nb, Cr, Rh, Pd, Ir, V, Au, Ag or combinations thereof;

the landing layer being a metal layer selected from W, Cu, Al, Ru, Pt, Ti, Ta, Ni, Co, Mo, Mn, Nb, Cr, Rh, Pd, Ir, V, Au, Ag, or combinations thereof;

the landing layer being a metal oxide or metal nitride layer;

the landing layer being a metal oxide layer selected from AlO, WO, HfO, TiO, TaO, InO, WO, CrO, RuO, CoO, MoO, ZrO, SnO, or combinations thereof;

the landing layer being a metal nitride layer selected from TiN, TaN, HfN, AlN, WN, MoN, NiN, NbN, CrN, RuN, CoN, ZrN, SrN or combinations thereof;

the substrate being a Si wafer;

the substrate being a crystalline silicon layer;

forming the patterned structure;

the patterned structure being 3D NAND apertures;

the patterned structure being contact holes;

the patterned structure being 3D NAND contact holes;

the patterned structure being DRAM contact;

the patterned structure being channel holes;

the patterned structure being 3D NAND channel holes;

the patterned structure being 3D NAND slit contact;

the aperture being staircase contacts;

the aperture being self-aligned contact;

the aperture being self-aligned vias;

the aperture being super vias;

further comprising introducing an additional etch gas into the reaction chamber;

the additional etch gas being selected from the group consisting of $cC_4F_8$, $C_4F_8$, $cC_5F_8$, $C_5F_8$, $C_4F_6$, $CF_4$, $CH_3F$, $CF_3H$, $CH_2F_2$, $C_3HF_7$, $C_3F_6$, $C_3H_2F_6$, $C_3H_2F_4$, $C_3H_3F_5$, $C_4HF_7$, $C_5HF_9$, $C_3F_6$, $C_3F_8$, $CF_3I$, $C_2F_3I$, $C_2F_5I$, $C_3F_7I$, 1-Iodoheptafluoropropane (1-$C_3F_7I$), 2-Iodoheptafluoropropane (2-$C_3F_7I$), $C_4F_9I$, $C_3HF_7$, COS, FNO, F—C≡N, $CS_2$, $SO_2$, $SF_6$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2- tetrafluorocyclobutane ($C_4H_4F_4$), and cis-1,1,2,2,3,4-hexafluorocyclobutane (cis-$C_4H_2F_6$), or combinations thereof;
introducing the oxygen and iodine-containing etching compound separately from the additional etch gas;
adding approximately 0.01% v/v to approximately 99.99% v/v of the additional etch gas to the oxygen and iodine-containing etching compound;
the patterned structure formed in the silicon-containing film having an aspect ratio between approximately 1:1 and approximately 200:1;
a doping concentration of Iodine being increase from 0.1 to 99.9% through the deposited film;
activating the plasma by applying RF power;
activating the plasma by a RF power ranging from approximately 25 W to approximately 100,000 W;
etching pressure ranging from approximately 1 mTorr to 10 Torr
etching pressure being 30 mTorr;
introducing the iodine-containing etching compound at a flow rate ranging from approximately 0.1 sccm to approximately 1 slm; and
maintaining the substrate at a temperature ranging from approximately −196° C. to approximately 500° C.

There is disclosed a method for forming a patterned structure, the method comprising the steps of:
a) introducing a vapor of $C_3F_7IO$ into a reaction chamber that contains a substrate, the substrate having a silicon-containing film deposited thereon and the patterned mask layer deposited on the silicon-containing layer;
b) activating a plasma to produce an activated $C_3F_7IO$; and
c) allowing an etching reaction to proceed between the activated $C_3F_7IO$ and the silicon-containing film to selectively etch the silicon-containing film from the patterned mask layer, thereby forming the patterned structure. The disclosed methods may include one or more of the following aspects:
the step c) comprising the step of: modifying the patterned mask layer by doping iodine from iodine ions produced from the activated oxygen and iodine-containing etching compound into the patterned mask layer;
the step c) comprising the step of: modifying the patterned mask layer;
the step c) comprising the step of: doping iodine from iodine ions produced from the activated oxygen and iodine-containing etching compound into the patterned mask layer;
a doping concentration of Iodine being increase from 0.1 to 99.9% through the deposited film; and
a selectivity of the oxygen and iodine-containing etching compound plasma etching $SiO_2$ over the patterned mask layer being approximately 70% higher than the selectivity of a benchmark gas $C_4F_6$ etching $SiO_2$ over the patterned mask layer with similar etch rates.

There is disclosed a method of modifying the surface of a substrate, the method comprising:
introducing a vapor of an oxygen and iodine-containing etching compound into a reaction chamber that contains the substrate, the substrate having a silicon-containing film deposited thereon and the patterned mask layer deposited on the silicon-containing layer, wherein the oxygen and iodine-containing etching compound has the formula $C_nH_xF_yI_zO_e$, wherein 4≤n≤10, 0≤x≤21, 0≤y≤21, 1≤z≤4 and 1≤e≤2; and
etching the silicon-containing film from the patterned mask layer to form a patterned structure using an activated oxygen and iodine-containing etching compound formed by activating a plasma,
wherein iodine from iodine ions produced from the activated oxygen and iodine-containing etching compound are doped into the patterned hardmask layer while forming the patterned structure in the substrate, thereby strengthening the patterned mask layer and minimizing damage of the patterned mask. The disclosed methods may include one or more of the following aspects:
oxygen and iodine-containing etching compound being $C_3F_7IO$ and its isomers;
a doping concentration of iodine being increase from 0.1 to 99.9% through the deposited film; and
selectivity of the oxygen and iodine-containing etching compound plasma etching $SiO_2$ over the patterned mask layer being approximately 70% higher than the selectivity of a benchmark gas $C_4F_6$ etching $SiO_2$ over the patterned mask layer with similar etch rates.

Notation and Nomenclature

The following detailed description and claims utilize a number of abbreviations, symbols, and terms, which are generally well known in the art, and include:

As used herein, the indefinite article "a" or "an" means one or more.

As used herein, "about" or "around" or "approximately" in the text or in a claim means±10% of the value stated.

As used herein, "room temperature" in the text or in a claim means from approximately 20° C. to approximately 25° C.

The term "ambient temperature" refers to an environment temperature approximately 20° C. to approximately 25° C.

The term "substrate" refers to a material or materials on which a process is conducted. The substrate may refer to a wafer having a material or materials on which a process is conducted. The substrates may be any suitable wafer used in semiconductor, photovoltaic, flat panel, or liquid-crystal display-thin-film transistor (LCD-TFT) device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiC, SiCN, SiOCN, SiCOH, etc.), metal containing layers (e.g., copper, cobalt, ruthenium, tungsten, manganese, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, dynamic random-access memory (DRAM), or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of silicon-containing films on a substrate and a patterned hardmask layer on the stack of silicon-containing films formed for pattern etch.

The term "pattern etch" or "patterned etch" refers to etching a non-planar structure, such as a patterned mask layer on a stack of silicon-containing films.

As used herein, the term "etch" or "etching" means to use a plasma to remove material via ion bombardment, remote plasma, or chemical vapor reaction between the etching gas and substrate and refers to an isotropic etching process and/or an anisotropic etching process. The isotropic etch process involves a chemical reaction between the etching compound and the substrate resulting in part of material on the substrate being removed. This type of etching process includes chemical dry etching, vapor phase chemical etching, thermal dry etching, or the like. The isotropic etch process produces a lateral or horizontal etch profile in a substrate. The isotropic etch process produces recesses or horizontal recesses on a sidewall of a pre-formed aperture in a substrate. The anisotropic etch process involves a plasma etching process (i.e., a dry etch process) in which ion bombardment accelerates the chemical reaction in the vertical direction so that vertical sidewalls are formed along the edges of the masked features at right angles to the substrate (Manos and Flamm, Thermal etching an Introduction, Academic Press, Inc. 1989 pp. 12-13). The plasma etching process produces a vertical etch profile in a substrate. The plasma etching process produces vertical vias, apertures, trenches, channel holes, gate trenches, staircase contacts, capacitor holes, contact holes, slit etch, self-aligned contact, self-aligned vias, super vias etc., in the substrate.

The term "mask" refers to a layer that resists etching. The mask layer may be located above the layer to be etched. The mask layer also refers to a hardmask layer. A mask layer can be a carbon-containing layer, a silicon-containing layer, a metal-containing or metal-oxide or metal-nitride containing layer.

The term "etch stop" refers to a layer below the layer to be etched that protects layers underneath.

The term "device channel" refers to layers that are part of actual device and any damage to it will affect device performance.

The term "aspect ratio" refers to a ratio of the height of a trench (or via) to the width of the trench (or the diameter of the via).

The term "selectivity" means the ratio of the etch rate of one material to the etch rate of another material. The term "selective etch" or "selectively etch" means to etch one material more than another material, or in other words to have a greater or less than 1:1 etch selectivity between two materials.

The term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x (NR^2R^3)_{(4-x)}$, where M is an atom, x is 2 or 3, the two or three $R^1$ groups may, but need not be identical to each other or to $R^2$ or to $R^3$. Further, it should be understood that unless specifically stated otherwise, values of R groups are independent of each other when used in different formulas.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "etching compound" and "etching gas" may be used interchangeably. It is understood that an etching compound may correspond to, or related to an etching gas, and that the etching gas may refer to the etching compound.

The terms "via", "aperture", "trench", and "hole" are sometimes used interchangeably, and generally mean an opening in an interlayer insulator.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements may be referred to by these abbreviations (e.g., Si refers to silicon, N refers to nitrogen, O refers to oxygen, C refers to carbon, H refers to hydrogen, F refers to fluorine, etc.).

The unique chemical abstract service (CAS) registry numbers (i.e., "CAS") assigned by the Chemical Abstract Service are provided to help better identify the molecules disclosed.

Please note that the silicon-containing films, such as silicon nitride and silicon oxide, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Preferably silicon oxide is $Si_nO_m$, where n ranges from 0.5 to 1.5 and m ranges from 1.5 to 3.5. More preferably, silicon oxide is $SiO_2$. Herein, SiN and SiO in the following description are used to represent $Si_kN_l$ and $Si_nO_m$ containing layers, respectively. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bC_cN_dH_e$, where a, b, c, d, e range from 0.1 to 6. The silicon-containing films may also include dopants, such as B, C, P, As Ga, In, Sn, Sb, Bi and/or Ge.

Ranges may be expressed herein as from about one particular value, and/or to about another particular value. When such a range is expressed, it is to be understood that another embodiment is from the one particular value and/or to the other particular value, along with all combinations within said range.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1A:
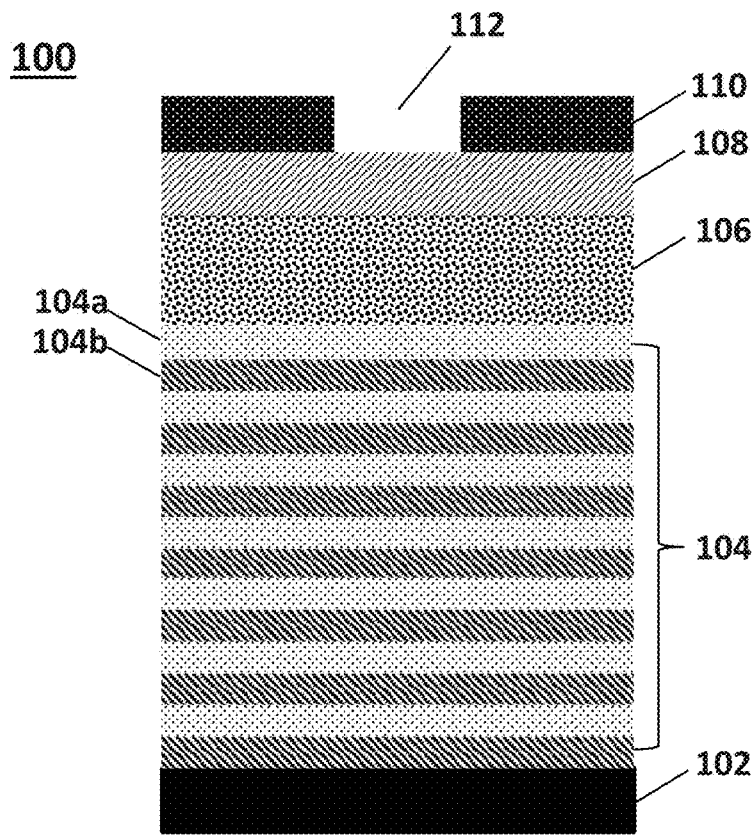
FIG. 1a is a cross-sectional side view of exemplary layers in a 3D NAND stack.

Disclosed are methods for plasma etching semiconductor structures, such as, trench, nanolines, nanopillars, channel holes, gate trenches, contacts, staircase contacts, capacitor holes, contact holes high aspect ratio structures, 3D NAND structure, DRAM structures, slit trenches, self-aligned contacts, vias, self-aligned vias, super vias etc., in silicon-containing films. The disclosed methods comprise the steps of i) introducing a vapor of an oxygen (alkoxy-containing) and iodine-containing etching compound into a reaction chamber that contains a substrate having a film deposited thereon, wherein a patterned mask layer is deposited on the film, wherein the oxygen and iodine-containing etching compound has the formula $C_aH_bF_cI_dO_e$, wherein $0 \leq a \leq 10$, $0 \leq b \leq 21$, $0 \leq c \leq 21$, $1 \leq d \leq 4$, and $1 \leq e \leq 2$; and ii) activating a plasma to produce an activated oxygen and iodine-containing etching compound capable of etching the film over the patterned mask layer from the substrate. While etching the film, the patterned mask layer is reinforced or strengthened by doping iodine from iodine ions produced from the activated oxygen and iodine-containing etching compound into the patterned mask layer, so that damages to the patterned mask layer is minimized. Here the film may be a silicon-containing film.

As shown in the examples that follow, the iodine ion in the disclosed oxygen and iodine-containing etching compounds dissociates from the compounds at low energies (eV) (i.e., <20 eV). As a result, Applicants believe that the disclosed etching compounds may be used in dry plasma etch processes that produce less damage to the underlying substrates because they may be performed at lower plasma energies. For example, the disclosed oxygen and iodine-containing etching compounds may be particularly suitable for low k etch processes in which damage is a particular concern because lower plasma energy may produce less damage to the porous low k material surrounding the etch site. The low damage to low k material may be due to the reduced generation of UV photons and F radicals given by oxygen and iodine-containing etching compounds. The disclosed oxygen and iodine-containing etching compounds may also prevent loss of the critical dimension and decrease low k surface roughness. In addition, molecules with two iodine atoms may enhance these benefits, increasing the doping level and the preservation of the mask layer without damaging the underneath layer.

Iodine (10.5 eV) has a lower ionization threshold than Fluorine (17.4 eV) and the inert gases: Ar (15.8 eV), Xe (12.1 eV), and Kr (14 eV). Iodine may therefore be more easily ionized by the plasma than fluorine and iodine-containing etching compound may increase the plasma density. Iodine, being a heavy element (with a mass of 127 amu), may also behave similarly to the inert gases (such as Kr, with 88 amu, and Xe, with 131 amu) in the plasma and accelerate towards the wafer. During the etch of high aspect ratio structure, the energy of the ions gets weaker as they penetrate deeper, therefore many ions cannot reach the bottom of trench. However, Iodine ions being heavy may be accelerated toward the wafers by the voltage applied during the plasma etch process and penetrate deeply allowing to etch deep pattern structures with high aspect ratio. Fluorine's ionization threshold serves to maintain it as a neutral species. As a result, fluorine typically participates in the etching process via chemical reactions. Iodine exhibits less chemical reactivity than fluorine and is ionized and bombards the surface during the plasma etch process. The bond energy for C—I is also less than the bond energy for C—F, thereby causing the C—I bond to more easily break in the plasma compared to C—F bonds. Thus, iodine ions may easily be doped into a-C mask layer. Since iodine is a heavy element that makes it easier to implant and penetrate deeply in the mask layer than lighter elements. In addition, due to the weakness of the C—I bond and the fact that Iodine ionization threshold is low, the iodine containing etching compound have a low to negligible atmospheric lifetime making them good candidates to reduce the global warming potential (GWP) caused by perfluorocarbon compounds. The average bond energies of various bonds are listed in Table 1 (from Huheey et al., Inorganic Chemistry, 4th ed. (1993).

TABLE 1

| Bond | Average Bond Energies (kJ/mol) |
|------|-------------------------------|
| C—I  | 213 |
| H—I  | 295 |
| C—C  | 346 |

TABLE 1-continued

| Bond | Average Bond Energies (kJ/mol) |
|---|---|
| C—O | 358 |
| C—H | 413 |
| C—F | 485 |
| C=O | 749 |

The iodine ion dissociates from the disclosed etching compounds at low eVs (i.e., <20 eV), referring to the Comparative Example below. However, iodine ion implantation into the mask feature, such as the surface and/or the body/bulk is likely. This implantation may help to strengthen, minimize the damage, increase etch resistance of the mask feature and help it maintain its shape and profile during the etching process. As shown in the examples that follow, after using the disclosed oxygen and iodine-containing etch compound the composition of the pattern mask is modified. Applicants believe that the iodine ions modify the surface and incorporate into the bulk of the pattern mask layer by increasing the crosslinking with the organic mask layer (such as amorphous carbon mask). Due to the doping of the iodine ions and the crosslinking among carbon, iodine, hydrogen and fluorine atoms, and preferably between carbon and iodine, the density of the pattern mask layer increases, making the pattern mask layer stronger. In the examples that follow the strengthening effect and the etch resistance improvement due to the iodine ions have been proved by showing that the etching rate of the pattern mask layer is lower when etched by iodine-containing etching compound than when is etched by the traditional etching gases, such as $cC_4F_8$ and $C_4F_6$.

The most important point of this invention is the understanding of the effect of iodine on the amorphous carbon. Iodine helps preserving the a-C mask while etching, by surface modifying and doping the a-C layer. And it helps minimize the damage by strengthening the pattern mask layer. During a plasma process, the disclosed iodine-containing gases or precursors may be generated into the following forms: 1) iodine ion ($I^+$, $I^-$); 2) iodine radical ($I\cdot$); 3) iodine-containing polymeric ion ($^+C_xH_yI_zF_dO_e$, $^-C_xH_yI_zF_dO_e$; and 4) iodine-containing polymeric radicals ($\cdot C_xH_yI_zF_dO_e$). The above mentioned iodine-containing species may be deposited onto the carbon-containing layer through a control of bias power. In addition, these chemical forms will deposit as a polymer layer that could enhance EUV absorption of layer during a patterning process. Iodine ions and radicals could be doped into carbon matrix to enhance EUV absorption of layer during patterning process such as resist less lithography. Such formed iodine-containing polymer and/or iodine-doped carbon layer may be utilized to increase the etch selectivity to towards the etched layer, such a silicon-containing layer.

The disclosed oxygen and iodine-containing etching compounds have the formula $$C_aH_bF_cI_dO_e,$$

wherein $0 \leq a \leq 10$, $0 \leq b \leq 21$, $0 \leq c \leq 21$, $1 \leq d \leq 4$, and $1 \leq e \leq 2$.

When the disclosed oxygen and iodine-containing etching compounds contain one oxygen (i.e., e=1), the disclosed oxygen and iodine-containing etching compounds have the formula $$C_aH_bF_cI_dO,$$

wherein $0 \leq a \leq 10$, $0 \leq b \leq 21$, $0 \leq c \leq 21$, $1 \leq d \leq 4$, wherein the oxygen connects two carbons being a bridge between two carbons.

When the disclosed oxygen and iodine-containing etching compounds contain no hydrogen (i.e., b=0), the disclosed oxygen and iodine-containing etching compounds have the formula $$C_aF_cI_dO_e,$$

wherein $0 \leq a \leq 10$, $0 \leq c \leq 21$, $1 \leq d \leq 4$ and $1 \leq e \leq 2$. In this case, when a=3, the disclosed oxygen and iodine-containing etching compounds have the formula $C_3F_cI_dO_e$, wherein $1 \leq d \leq 4$, $c \leq 10-d$ and $1 \leq e \leq 2$. Exemplary $C_3$ oxygen and iodine-containing etching compounds without containing H include $C_3F_7IO$, $C_3F_6I_2O$, $C_3F_5I_3O$, $C_3F_4I_4O$ and their isomers.

Exemplary disclosed oxygen and iodine-containing etching compounds without containing H include $C_3F_7IO$, $C_3F_6I_2O$, $C_3F_5I_3O$, $C_3F_4I_4O$, $C_4F_9IO$, $C_4F_8I_2O$, $C_4F_7I_3O$, $C_4F_6I_4O$, $C_5F_{11}IO$, $C_5F_{10}I_2O$, $C_5F_9I_3O$, $C_5F_8I_4O$, $C_6F_{13}IO$, $C_6F_{12}I_2O$, $C_6F_{11}I_3O$, $C_6CF_{10}I_4O$, $C_7F_{15}IO$, $C_7F_{14}I_2O$, $C_7F_{13}I_3O$, $C_7F_{12}I_4O$, $C_8F_{17}IO$, $C_8F_{16}I_2O$, $C_8F_{15}I_3O$, $C_8F_{14}I_4O$, $C_9F_{19}IO$, $C_9F_{18}I_2O$, $C_9F_{17}I_3O$, $C_8F_{16}I_4O$, $C_{10}F_{21}IO$, $C_{10}F_{20}I_2O$, $C_{10}F_{19}I_3O$, $C_{10}F_{18}I_4O$ and their isomers. Here the oxygen connects two carbons being a bridge between the two carbons.

Exemplary disclosed oxygen and iodine-containing etching compounds having one oxygen and one iodine without containing H having a general formula: $C_aF_{2a+1}IO$, where $0 \leq a \leq 10$, are listed in Table 2. These molecules are commercially available or may be synthesized by methods known in the art. Their structure formula, CAS numbers and boiling points are included in Table 2. The disclosed oxygen and iodine-containing etching compounds without containing H having a general formula: $C_aF_{2a+1}IO$, where $3 \leq a \leq 10$, may also include their isomers. More specifically, oxygen connects two carbons being a bridge between the two carbons.

TABLE 2

| Etching compounds | Formula | Structure | CAS number | Boiling point (° C.) |
|---|---|---|---|---|
| 2-Iodo-1-(trifluoromethoxy)tetrafluoroethane | $C_3F_7IO$ | 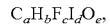 | 1561-52-0 | 47.5 |
| 1,1,1,2-tetrafluoro-2-Iodo-2-(trifluoromethoxy)ethane | $C_3F_7IO$ |  | 139604-89-0 | 43-44 |

TABLE 2-continued

| Etching compounds | Formula | Structure | CAS number | Boiling point (° C.) |
|---|---|---|---|---|
| 1,2,2,2-tetrafluoro-1-trifluoromethoxy-1-iodoethane | $C_3F_7IO$ | 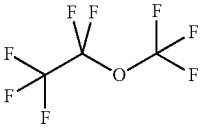 [SMILES: FC(F)(F)OC(F)(F)C(F)(F)F] | 69066-98-4 | |
| 1,1,1,2,2,3,3-heptafluoro-3-iodosyl-propane | $C_3F_7IO$ | 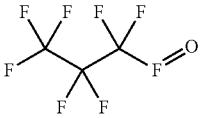 | 180613-10-9 | |
| 1,1,1,2,2-pentafluoro-2-(1,1,2,2-tetrafluoro-2-iodoethoxy)ethane | $C_4F_9IO$ | 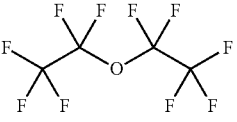 [SMILES: FC(F)(F)C(F)(F)OC(F)(F)C(F)(F)F] | 1024614-72-9 | ~92 |
| 1,1,1,2,3,3,3-heptafluoro-2-(1,1,2,2-tetrafluoro-2-iodoethoxy)propane | $C_5F_{11}IO$ | 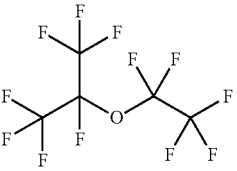 | 16005-38-2 | 88 |
| 1,1,1,2,2,3,3-heptafluoro-3-(1,2,2,2-tetrafluoro-1-iodoethoxy)propane | $C_5F_{11}IO$ | 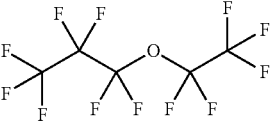 | 107432-46-2 | 86 |
| 1,1,1,2,3,3,3-heptafluoro-2-(1,1,2,3,3,3-hexafluoro-2-iodopropoxy)propane | $C_5F_{11}IO$ | 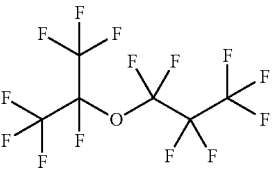 | 16005-45-1 | ~128 |
| 1-odo-4-(heptafluoroisopropoxy)octafluorobutane | $C_7F_{15}IO$ | 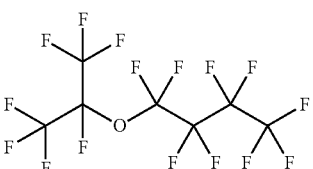 | 25080-17-5 | 40-43 |
| Hexane,1,1,2,2,3,3,4,4,5,5,3,3-dodecafluoro-1-odo-6-(1,1,2,2,2-pentafluoroethoxy)- | $C_8F_{17}IO$ | 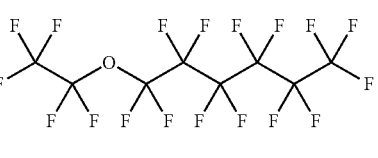 | 1942922-97-5 | ~166 |
| 1-iodo-6-(heptafluoroisopropoxy)perfluorohexane | $C_9F_{19}IO$ | 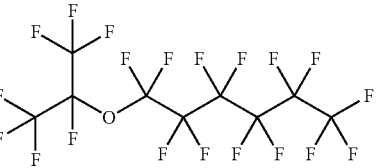 | 25080-18-6 | ~189 |

TABLE 2-continued

| Etching compounds | Formula | Structure | CAS number | Boiling point (° C.) |
|---|---|---|---|---|
| Octane-1-$^{13}$C, 1,1,2,2,3,3,4,4,5,5,6,6,7,7,8,8,8-heptadecafluoro-1-(1,2,2,2-tetrafluoro-1-iodoethoxy)-(9CI) | $C_{10}F_{21}IO$ | [structure diagram] | 864071-12-5 | |

The sign ~ means value predicted by SciFinder website

The disclosed oxygen and iodine-containing etching compounds are suitable for etching silicon-containing films that include a layer of silicon oxide (SiO), silicon nitride (SiN), pure silicon (Si) such as crystalline Si, poly-silicon (p-Si or polycrystalline Si), or amorphous silicon, low-k SiCOH, SiOCN, SiC, SiON, $Si_aO_bH_cC_dN_e$, where a>0; b, c, d and e≥0, or combinations thereof. The silicon-containing film may also include silicon oxide and silicon nitride alternating layers (ONON) or silicon oxide and poly-silicon alternating layers (OPOP). The silicon-containing films may also include dopants, such as B, C, P, As Ga, In, Sn, Sb, Bi and/or Ge.

The etch rates of SiO and SiN may be enhanced while maintaining high selectivity to the mask layer when the disclosed oxygen and iodine-containing etching compounds include H, but are not limited to. The disclosed oxygen and iodine-containing etching compounds having one H when b=1 have the formula $C_aHF_cI_dO_e$, wherein 3≤a≤10, 0≤c≤20, 1≤d≤4, and y+z≤2n+1 and 1≤e≤2. Exemplary compounds having one H include $C_3HF_6IO$, $C_3HF_5I_2O$, $C_3HF_4I_3O$, $C_3HF_3I_4O$, $C_4HF_8IO$, $C_4HF_7I_2O$, $C_4HF_6I_3O$, $C_4HF_5I_4O$, $C_5HF_{10}IO$, $C_5HF_9I_2O$, $C_5HF_8I_3O$, $C_5HF_7I_4O$, $C_6HF_{12}IO$, $C_6HF_{11}I_2O$, $C_6HF_9I_3O$, $C_6HF_8I_4O$, $C_7HF_{14}IO$, $C_7HF_{13}I_2O$, $C_7HF_{12}I_3O$, $C_7HF_{11}I_4O$, $C_8HF_{16}IO$, $C_8HF_{15}I_2O$, $C_8HF_{14}I_3O$, $C_8HF_{10}I_4O$, $C_9HF_{18}IO$, $C_9HF_{17}I_2O$, $C_9HF_{16}I_3O$, $C_9HF_{15}I_4O$, $C_{10}HF_{20}IO$, $C_{10}HF_{19}I_2O$, $C_{10}HF_{18}I_3O$, $C_{10}HF_{17}I_4O$ and their isomers.

The disclosed oxygen and iodine-containing etching compounds having two hydrogens when b=2 have the formula $C_aH_2F_cI_dO_e$, wherein 3≤a≤10, 0≤c≤19, 1≤d≤4, and c+d≤2n and 1≤e≤2. Exemplary compounds include The disclosed oxygen and iodine-containing etching compounds having three hydrogens when b=3 have the formula $C_aH_3F_cI_dO_e$, wherein 3≤a≤10, 0≤c≤19, 1≤d≤4, and c+d≤2n-1 and 1≤e≤2.

The disclosed oxygen and iodine-containing etching compounds having four hydrogens when b=4 have the formula $C_aH_4F_cI_dO_e$, wherein 3≤a≤10, 0≤c≤19, 1≤d≤4, and c+d≤2n-2 and 1≤e≤2.

Applicants believe that the molecules having 3 or more than 3 carbon atoms may provide better etch rate and sidewall protection, e.g., straight profile, no bowing, no tapering, no twisting, no incomplete etch, no variation of critical dimension from top to bottom of the structure etched, during the etching process than less than 3 carbon molecules. Applicants believe that the molecules having 4 or more than 4 carbon atoms may also provide a straighter profile, without bowing, tapering, twisting and incomplete etch, or variation of critical dimension from top to bottom of the structure etched than less than 4 carbon molecules. For sidewall protection, the carbon ≥3 molecules are preferred because Applicants believe they will produce thicker passivation layers.

The disclosed oxygen and iodine-containing etching compounds may provide high selectivity to mask layers, photoresist, etch stop layers and device channel materials and no profile distortion in high aspect ratio structures (HAR), such as those having an aspect ratio ranging from 1:1 to 200:1 such as DRAM and 3D NAND memories and logic structures. Alternatively, the disclosed oxygen and iodine-containing etching compounds may provide high selectivity to mask layers or silicon-containing film, such as those having an aspect ratio ranging from 1:1 to 200:1 in contact etch applications.

The disclosed oxygen and iodine-containing etching compounds may provide infinite selectivity for wide process conditions of etching. Herein the selectivity refers to the etching rate ratio of two different layers. For example, the selectivity for SiO layer vs. a-C layer is the etch rate of the SiO divided by the etching rate of the a-C layer. The disclosed oxygen and iodine-containing etching compounds may provide improved selectivity between the silicon-containing films and mask materials, less damage to channel region, improved critical dimension uniformity and reduced profile distortion such as bowing, twisting, tapering, notching, under-cut, maintain the same critical dimension from top to bottom of the etch structure and arcing in pattern high aspect ratio structures.

The disclosed oxygen and iodine-containing etching compounds may etch through alternating layers of p-Si, SiO, and/or SiN, resulting in a vertical etch profile. (i.e., demonstrating selectivity ranging from 2:1 to 1:2 between the alternating layers). The disclosed oxygen and iodine-containing etching compound plasma etches the alternating SiO and SiN (ONON) layers having a selectivity between approximately 1:2 to approximately 2:1 with respect to the SiO layer versus SiN layer. Preferably, the disclosed oxygen and iodine-containing etching compound plasma etches the alternating SiO and SiN (ONON) layers having a selectivity of approximately 1:1 with respect to the SiO layer versus SiN layer.

The disclosed oxygen and iodine-containing etching compounds are provided at greater than 95% v/v purity, preferably at greater than 99.99% v/v purity, and more preferably at greater than 99.999% v/v purity. The disclosed oxygen and iodine-containing etching compounds contain less than 5% by volume trace gas impurities, with less than 150 ppm by volume of impurity gases, such as $N_2$ and/or $H_2O$ and/or $CO_2$, contained in said trace gaseous impurities. Preferably, the water content in the plasma etching gas is less than 20 ppm by weight. The purified product may be produced by distillation and/or passing the gas or liquid through a suitable adsorbent, such as a 4 Å molecular sieve.

The disclosed oxygen and iodine-containing etching compounds contain less than 10% v/v, preferably less than 1% v/v, more preferably less than 0.1% v/v, and even more preferably less than 0.01% v/v of any of its isomers, which may be purified by distillation of the gas or liquid to remove isomers and may provide better process repeatability.

Alternatively, the disclosed oxygen and iodine-containing etching compounds may contain between 0.01% v/v and 99.99% v/v of its isomers, particularly when the isomer mixture provides improved process parameters or if isolation of the target isomer is too difficult or expensive. For example, the disclosed oxygen and iodine-containing etching compounds may comprise between approximately 50% v/v and approximately 75% v/v 2-Iodo-1-(trifluoromethoxy) tetrafluoroethane and between approximately 25% v/v and approximately 50% v/v 1,1,1,2-tetrafluoro-2-iodo-2-(trifluoromethoxy)ethane and between approximately 25% v/v and approximately 50% v/v 1,2,2,2-tetrafluoro-1-trifluoromethoxy-1-iodoethane. The mixture of isomers may also reduce the need for two or more gas lines to the reaction chamber.

Some of the disclosed oxygen and iodine-containing etching compounds are gaseous at room temperature and atmospheric pressure. For the non-gaseous (i.e., liquid or solid) compounds, their gas form may be produced by vaporizing the compounds through a conventional vaporization step, such as direct vaporization or by bubbling with inert gas (such as $N_2$, Ar, He). The non-gaseous compounds may be fed in liquid state to a vaporizer where it is vaporized before it is introduced into a reactor.

The disclosed oxygen and iodine-containing etching compounds are suitable for plasma etching semiconductor structures, such as, channel holes, gate trenches, staircase contacts, slits, capacitor holes, contact holes, self-aligned contact, self-aligned vias, super vias etc., in the silicon-containing films. The disclosed oxygen and iodine-containing etching compounds are not only compatible with currently available mask materials but also compatible with the future generations of mask materials because the disclosed oxygen and iodine-containing etching compounds induce little to no damage on the mask along with good profile of high aspect ratio structures. In other words, the disclosed oxygen and iodine-containing etching compounds may produce vertical etched patterns having minimal to no bowing, pattern collapse, or roughness. In order to achieve these properties, the disclosed oxygen and iodine-containing etching compounds may deposit an etch-resistant polymer layer during etching to help reduce the direct impact of the oxygen and fluorine radicals during the etching process. The disclosed oxygen and iodine-containing etching compounds may also reduce damage to p-Si or crystalline Si channel and silicon-containing structure during etching.

The disclosed oxygen and iodine-containing etching compounds selectively etch the silicon-containing layers from a buried landing layer or material which is a metal layer located at the bottom of the structure to be etched in most applications. The disclosed oxygen and iodine-containing etching compounds do not etch the landing layers or metal landing layers. The buried landing layer may be an etching stop layer or a diffusion barrier layer. Materials of the metal landing layers may be a tungsten metal word-line in a 3D NAND structure and/or another metal such as W, Cu, Al, Ru, Pt, Ti, Ta, Ni, Co, Mo, Mn, Pd, Ir, Nb, Cr, Rh, V, Au, Ag or combination thereof and/or etch stop layers such as metals or metal oxides or nitrides layer such as AlO, WO, HfO, TiO, TaO, InO, CrO, RuO, CoO, MoO, ZrO, SnO TiN, TaN, HfN, AlN, WN, MoN, NiN, NbN CrN, RuN, CoN, ZrN, SnN or combination thereof etc. The disclosed oxygen and iodine-containing etching compounds induce little to no damage to the material at bottom of the contact hole, staircase and slit (such as tungsten metal world line in a 3D NAND structure and/or other metals such as W, Cu, Al, Ru, Pt, Ti, Ta, Ni, Co, Mo, Mn, Pd, Ir, Nb, Cr, Rh, V, Au, Ag or combination thereof etc.) and/or etch stop layers such as metals or metal oxides or nitrides layer (AlO, WO, HfO, TiO, TaO, InO, CrO, RuO, CoO, MoO, ZrO, SnO TiN, TaN, HfN, AlN, WN, MoN, NiN, NbN, CrN, RuN, CoN, ZrN, SnN or combination thereof etc.). One of ordinary skill in the art will recognize that a barrier layer can also be composed of a combination of the previously mentioned metals and metals oxide and nitride, such a barrier layer being Ti/TiN, Ti/TiN/Ti, TiZrN, Ta/TaN, TaN/Cu/TaN, TaN/Ru/TaN etc. A barrier might also contained silicide (such as TiSiN, TaSiN, $TiSi_2$, MnSiO, etc.), phosphide (such as CuWP, NiMoP, NiP etc.), carbide (such as TaC, TaCN, WCN etc.), boride (such as NiMoB, NiB etc.) or combination thereof. Preferably, the disclosed oxygen and iodine-containing etching compounds are suitably volatile and stable during the etching process for delivery into the reactor/chamber.

Material compatibility tests are important to determine if any of the disclosed oxygen and iodine-containing etching compounds will react with chamber materials and degrade the performance of the chamber with short term or long-term use. Key materials involved in parts of the chamber, valves, etc. include stainless steel, aluminum, nickel, Polychlorotrifluoroethene (PCTFE), polyvinylidene fluoride (PVDF), Polytetrafluoroethylene (PTFE), PFA, PP, kalrez, viton and other metals and polymers. At times these materials are exposed to high temperatures, for example, higher than 20° C., and high pressures, for example, higher than 1 atm, which may enhance their degradation. The metrology methods may include visual inspection, weight measurement, measuring nanometer scale changes in scanning electron microscopy (SEM), tensile strength, hardness, etc.

The disclosed oxygen and iodine-containing etching compounds may be used to plasma etch silicon-containing films on a substrate. The disclosed plasma etching method may be useful in the manufacture of semiconductor devices such as NAND or 3D NAND gates or Flash or DRAM memory or transistors such as fin-shaped field-effect transistor (FinFET), Gate All Around (GAA)-FET, Nanowire-FET, Nanosheet-FET, Forksheet-FET, Complementary FET (CFET), Bulk complementary metal-oxide-semiconductor (Bulk CMOS), MOSFET, fully depleted silicon-on-insulator (FD-SOI) structures. The disclosed oxygen and iodine-containing etching compounds may be used in other areas of applications, such as different front end of the line (FEOL) and back end of the line (BEOL) etch applications. Additionally, the disclosed oxygen and iodine-containing etching compounds may also be used for etching Si in 3D through silicon via (TSV) etch applications for interconnecting memory to logic on a substrate and in MEMS applications.

The plasma etching method includes providing a reaction chamber having a substrate disposed therein. The reaction chamber may be any enclosure or chamber within a device in which etching methods take place such as, and without limitation, reactive ion etching (RIE), capacitively coupled plasma (CCP) with single or multiple frequency RF sources, inductively coupled plasma (ICP), or microwave plasma reactors, or other types of etching systems capable of selectively removing a portion of the silicon-containing film or generating active species. One of ordinary skill in the art will recognize that the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher dielectric etch product family sold under the trademark 2300® Flex™, The RF power in such may be pulsed to control plasma properties and thereby improving the etch performance (selectivity and damage) further.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant $O_2$ may be decomposed into two O radicals. Preferably, the remote plasma may be generated with a power ranging from about 1 kW to about 10 kW, more preferably from about 2.5 kW to about 7.5 kW.

The reaction chamber may contain one or more than one substrate. For example, the reaction chamber may contain from 1 to 200 silicon wafers having from 25.4 mm to 450 mm diameters. The substrates may be any suitable substrates used in semiconductor, photovoltaic, flat panel or LCD-TFT device manufacturing. Examples of suitable substrates include wafers, such as silicon, silica, glass, Ge, SiGe, GeSn, InGaAs, GaSb, InP, or GaAs wafers. The wafer will have multiple films or layers on it from previous manufacturing steps, including silicon-containing films or layers. The layers may or may not be patterned. Examples of suitable layers include without limitation silicon (such as amorphous silicon, p-Si, crystalline silicon, any of which may further be p-doped or n-doped with B, C, P, As, Ga, In, Sn, Sb, Bi and/or Ge), silica, silicon nitride, silicon oxide, silicon oxynitride, $Si_aO_bH_cC_dN_e$, (wherein a>0; b, c, d, e≥0), Ge, SiGe, GeSn, InGaAs, GaSb, InP; mask layer materials such as amorphous carbon with or without dopants, antireflective coatings, photoresist materials, a metal oxide, such as AlO, TiO, HfO, ZrO, SnO, TaO etc. or a metal nitride layer such as AlN, ZrN, SnN, HfN, titanium nitride, tantalum nitride etc. or combinations thereof; etch stop layer materials such as silicon nitride, polysilicon, crystalline silicon, silicon carbide, SiON, SiCN or combinations thereof, device channel materials such crystalline silicon, epitaxial silicon, doped silicon, $Si_aO_bH_cC_dN_e$, (wherein a>0; b, c, d, e≥0) or combinations thereof. In one example the mask layer may be composed of two or more layers such a combination of carbon-containing layer, and/or silicon-containing layer and/or metal-containing layer. In one example the mask might be SiN and TiN and the landing layer Cu, W, or Ru. The silicon oxide layer may form a dielectric material, such as an organic based or silicon oxide based low-k dielectric material (e.g., a porous SiCOH film). An exemplary low-k dielectric material is sold by Applied Materials under the trade name Black Diamond II or Ill. Additionally, layers comprising tungsten or noble metals (e.g. platinum, palladium, rhodium or gold) may be used. Furthermore, examples of the silicon-containing films may be $Si_aO_bH_cC_dN_e$, (wherein a>0; b, c, d, e≥0). Throughout the specification and claims, the wafer and any associated layers thereon are referred to as substrates.

The following are exemplary embodiments of the substrates on which the disclosed oxygen and iodine-containing etching compounds may be applied to etch.

Figure 1B:
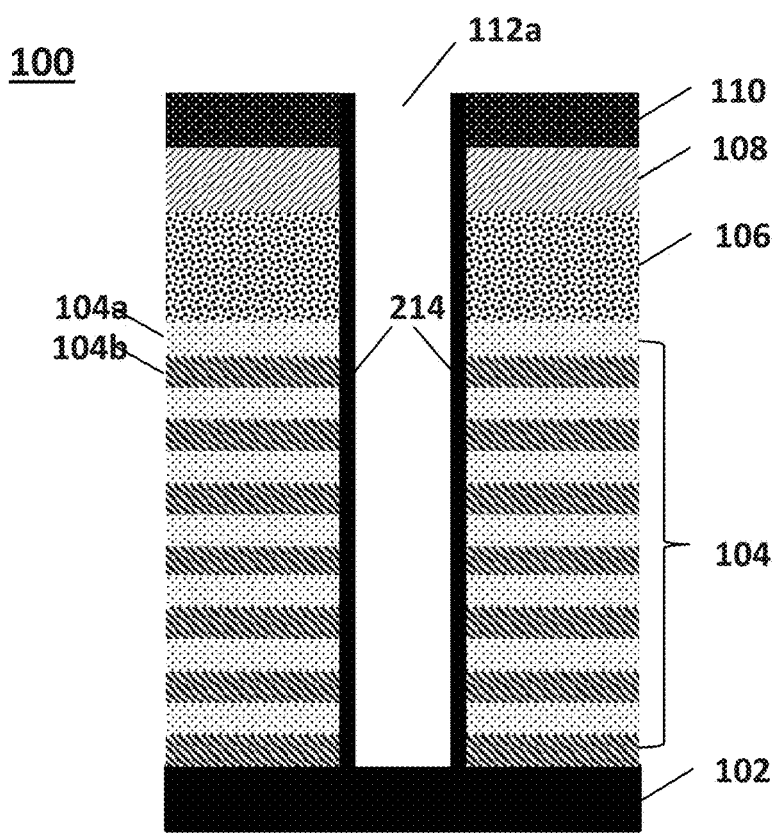
FIG. 1b is a cross-sectional side view of the exemplary layers in the 3D NAND stack showing polymer deposited on a sidewall during etching of the 3D NAND stack.

In one embodiment, a substrate 100 may include a stack of multiple layers as shown in FIG. 1a. FIG. 1a is a cross-sectional side view of exemplary layers in a 3D NAND stack to produce a 3D NAND gate. In FIG. 1a, a stack of seven alternative SiO/SiN (i.e., 104a/104b) layers 104 is located on top of a silicon wafer 102 (i.e., ONON or terabit cell array transistor (TCAT) technology). In some applications, the wafer 102 may be a buried landing layer or material, such as tungsten metal word-line in a 3D NAND structure and/or another metal such as W, Cu, Al, Ru, Pt, Ti, Ta, Ni, Co, Mo, Mn, Pd, Ir, Nb, Cr, Rh, V, Au, Ag or combination thereof etc. and/or etch stop or diffusion barrier layers such as metals or metal oxides or nitrides layer (AlO, WO, HfO, TiO, TaO, InO, WO, CrO, RuO, CoO, MoO, TIN, TaN, HfN, AlN, WN, MoN, NiN, NbN, CrN, RuN, CoN or combination thereof etc.). One of ordinary skill in the art will recognize that a barrier layer can also be composed of a combination of the previously mentioned metals and metals oxide and nitride, such a barrier layer being Ti/TiN, Ti/TiN/Ti, TiZrN, Ta/TaN, TaN/Cu/TaN, TaN/Ru/TaN etc. A barrier might also contained silicide (such as TiSiN, TaSiN, $TiSi_2$, MnSiO, etc.), phosphide (such as CuWP, NiMoP, NiP etc.), carbide (such as TaC, TaCN, WCN etc.), boride (such as NiMoB, NiB etc.) or combination thereof. One of ordinary skill in the art will recognize that some technologies replace the SiN layers 104b with p-Si layers (e.g. SiO/p-Si or pipe-shaped bit cost scalable (P-BICS) technology). A hardmask layer 106 is located on the top of the seven SiO/SiN layers 104. The hardmask layer 106 may be an amorphous carbon (a-C) hardmask layer with or without dopants. The hardmask layer 106 may be a layer of CVD, PECVD, ALD, PEALD or spin on deposited (SOD) amorphous carbon or doped amorphous carbon, silicon-containing spin on mask, or carbon-containing spin on mask. The hardmask layer 106 may contain C and H, as well as other elements, such as boron, nitrogen, sulfur, chlorine, fluorine or metals (Al, Zr, Ti, W, Y) etc., to improve etch resistance during SiO/SiN layer etch. In this case, the hardmask layer 106 is a doped a-C layer, for example, a boron-doped a-C layer, a tungsten-doped a-C layer, etc. An antireflective coating layer 108 is located on top of the hardmask layer 106. A patterned photoresist layer 110 is located on top of the antireflective coating layer 108 with pattern 112. Herein, a SiON layer (not shown) may be present between the antireflective coating layer 108 and the hardmask layer 106 to transfer the pattern 112 in photoresist layer 110 to the hardmask layer 106 to form a patterned hardmask layer (not shown). One of ordinary skill in the art will recognize that the stack of layers in the substrate 100 in FIG. 1a is provided for exemplary purposes only and that the disclosed oxygen and iodine-containing etching compounds may be used to etch other types of stacks of layers. Furthermore, one of ordinary skill in the art will recognize that the number alternating SiC/SiN or SiO/p-Si layers 104 in the stack of the substrate 100 may vary (i.e., may include more or less than the seven SiO/SiN (104a/104b) layers depicted), FIG. 1b is a cross-sectional side view of the exemplary layers in the 3D NAND stack of FIG. 1a showing polymer deposited on sidewalls of a structure or a via 112a formed by etching. The disclosed oxygen and iodine-containing etching compounds may produce fragments during the plasma process that are suitable for both anisotropically etching the silicon-containing films 104 and depositing an oxygen and iodine-containing polymer passivation layer 214 on sidewalls of the structure or via 112a being etched as shown in FIG. 1b. The difference between FIG. 1b and FIG. 1a is in FIG. 1b structure or via 112a is formed in substrate 100 by plasma etching using the disclosed oxygen and iodine-containing etch compounds, which also deposit the polymer passivation layer 214 on the sidewalls of the structure or via 112a. The polymer passivation layer 214 also provides smoother sidewall, less bowing and less deformation at the bottom of the structure or via 212. The polymer passivation layer 214 may however be easily removed or cleaned by dry or wet etch chemistries known in the art.

Figure 1C:
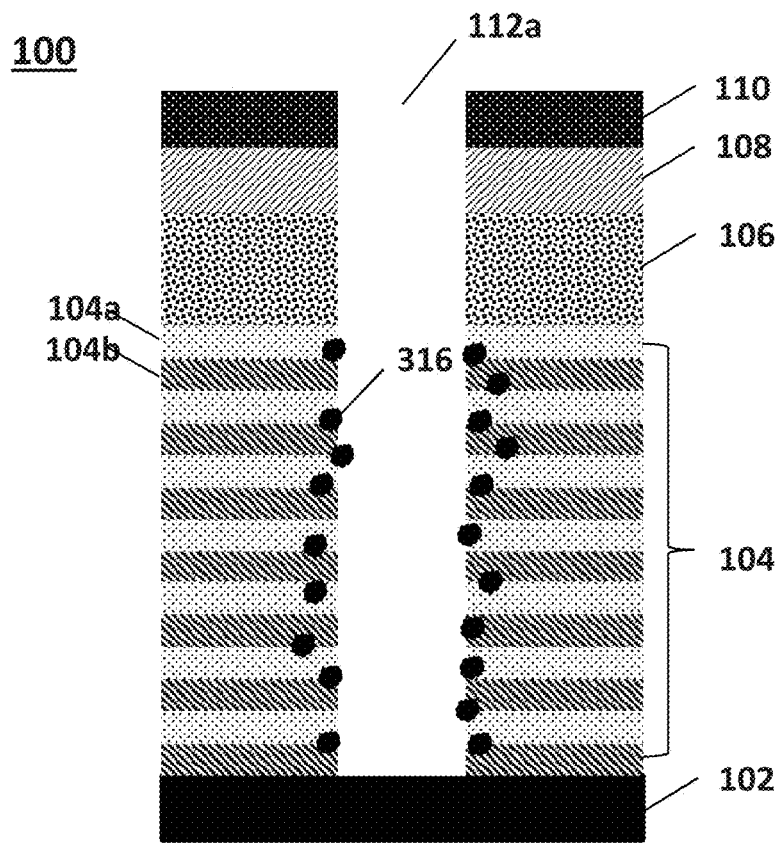
FIG. 1c is a cross-sectional side view of the exemplary layers in the 3D NAND stack showing particles generated during alternating SiO/SiN layer etching of a 3D NAND stack.

FIG. 1c is a cross-sectional side view of the exemplary layers in the 3D NAND stack of FIG. 1a showing particles 316 generated during alternating SiO/SiN layer etching in a 3D NAND stack. The particles 316 generated on the sidewalls of the alternative SiO/SiN (i.e., 104a/104b) layers 104 as shown in FIG. 1c may be minimized by using the disclosed oxygen and iodine-containing etching compounds. The difference between FIG. 1c and FIG. 1b is in FIG. 1c the alternative SiO/SiN exposed sidewall has particles 316 generated during plasma etching. Applicants do not believe that the disclosed oxygen and iodine-containing etching compounds will generate the particles 316 shown in FIG. 1c.

Figure 1D:
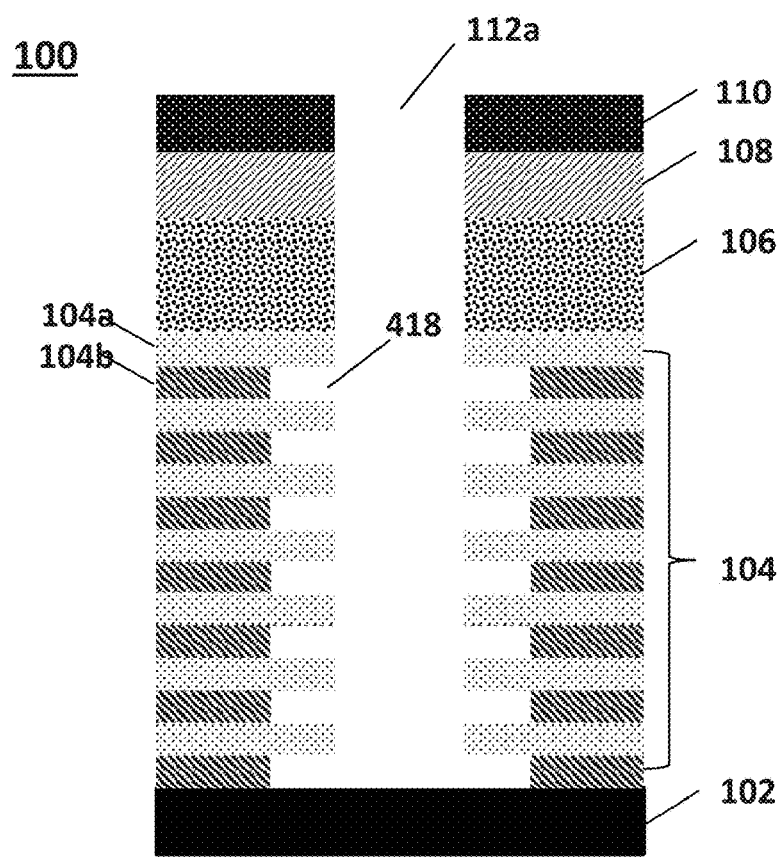
FIG. 1d is a cross-sectional side view of the exemplary layers in the 3D NAND stack showing selective etching of SiN exposed on the sidewall in the 3D NAND stack.

FIG. 1d is a cross-sectional side view of the exemplary layers in the 3D NAND stack of FIG. 1a showing selective isotropic etching of the SiN layers 104b exposed on the sidewall in the 3D NAND stack after the anisotropic etching process. The SiN exposed sidewall in stack 100 may be etched selectively as shown in FIG. 1d by using the disclosed oxygen and iodine-containing etching compounds to selectively break the Si—N bonds in the SiN layers 104b over the Si—O bond in the SiO layers 104a forming a selective sidewall SiN etch 418 on the stack of SiO/SiN layers 104 in the via 112a. The difference between FIG. 1d and FIG. 1b is in FIG. 1d SiN layer exposed on the alternative SiO/SiN sidewall is selectively etched by the disclosed oxygen and iodine-containing etching compounds forming the selective sidewall SiN etch 418. Typically, the selective sidewall SiN etch 418 is performed by wet etching using mixtures with phosphoric acid. Replacing wet etch process with dry plasma etch processes is known to greatly improve the economics of semiconductor device fabrication process since wet etching requires moving the substrate to different wet etching equipment. With the disclosed methods, all etching, including the selective sidewall SiN etch of FIG. 1d, may be performed in one piece of etching equipment, which may reduce the cost of the semiconductor fabrication.

Figure 2:
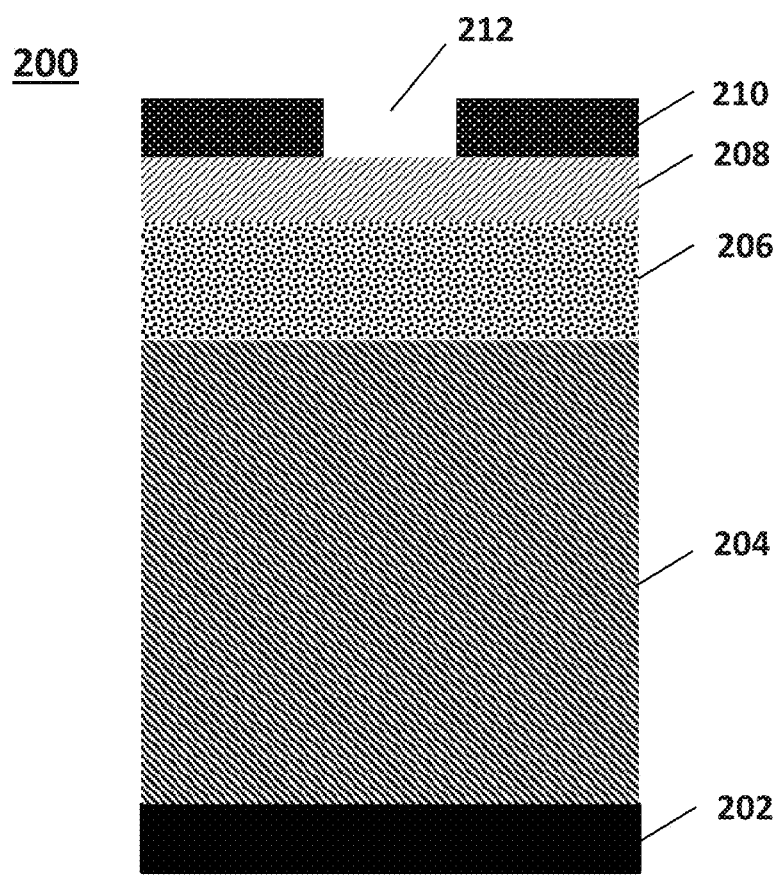
FIG. 2 is a cross-sectional side view of exemplary layers of a DRAM stack.

In alternative embodiment, substrate 200 may include a stack of multiple layers as shown in FIG. 2, which is a cross-sectional side view of exemplary layers in a DRAM stack to produce a DRAM memory. As shown, a stack of four layers is located on top of a silicon wafer 202. A hardmask layer 206 is located on top of a large SiO layer 204. An antireflective coating layer 208 is located on top of the hardmask layer 206. A pattern photoresist layer 210 is located on top of the antireflective coating 208. A SiON layer (not shown) may be present between the antireflective coating layer 208 and the hardmask layer 206 to transfer pattern 212 in photoresist layer 210 to the hardmask layer 206. One of ordinary skill in the art will recognize that the stack of layers in FIG. 2 is provided for exemplary purposes only and that the disclosed oxygen and iodine-containing etching compounds may be used to etch other stacks of layers, for example, for a stack where the hardmask layer 206 is replaced with a TiN layer. Furthermore, one of ordinary skill in the art will recognize that the number of layers in the stack may vary (i.e., may include more or less than the layers depicted).

Figure 3A:
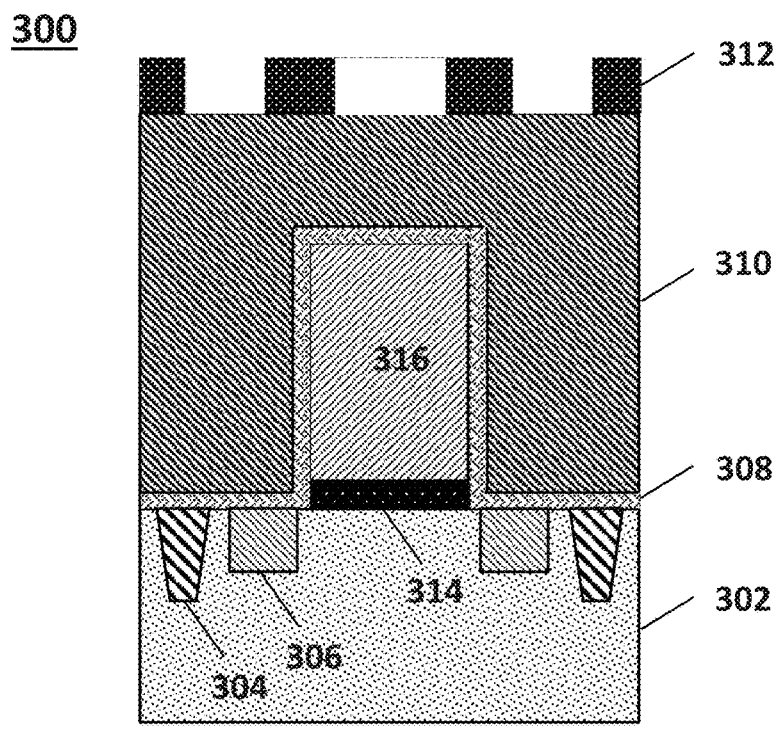
FIG. 3a is a cross-sectional side view of exemplary layers showing photoresist pattern over SiO insulation layer surrounding typical transistor device region to produce a transistor structure.

FIG. 3a is a cross-sectional side view of exemplary layers showing photoresist pattern over SiO insulation layer surrounding a typical transistor device region to produce a transistor structure. As shown, substrate 300 may include a stack of four layers surrounding a transistor gate electrode region supported on silicon wafer 302. The transistor region as shown includes two doped silicon regions 306 acting as source and drain. Transistor gate dielectric 314 is presented underneath gate electrode 316. The whole transistor, i.e., transistor gate dielectric 314 and gate electrode 316, is surrounded by a thin SiN layer 308 which may later act as etch stop layer during contact etch. Each transistor device region 306/316 is separated by SiO isolation regions 304 in the silicon wafer 302 to minimize electrical interference. One of ordinary skill in the art will recognize that layer 302 may be located on top of a silicon oxide layer of the Silicon on Insulator (SOI) wafer (not shown). Another SiO layer 310 as an insulation layer is deposited on the transistor and used to insulate any metal contact to the transistor device regions 306. Patterned photoresist mask 312 is used to pattern the SiO layer 310. Etching is performed using the disclosed oxygen and iodine-containing etching compounds in plasma environment. The patterned photoresist mask 312 serves as a template to etch the SiO layer 310 and etching is stopped on the SiN layer 308 as shown in FIG. 3b.

Figure 3B:
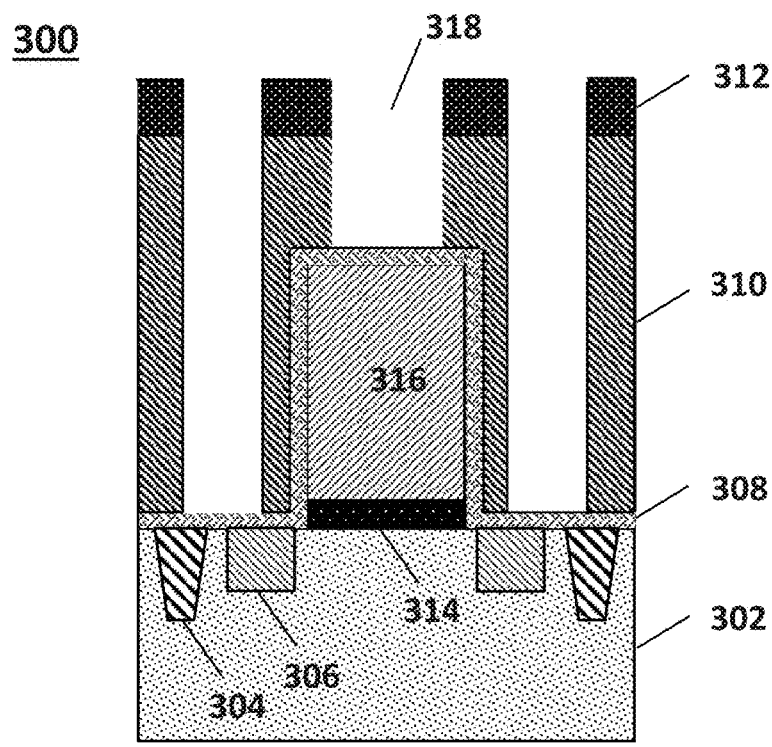
FIG. 3b is a cross-sectional side view of the exemplary layers of FIG. 3a after etching the SiO insulation layer.

FIG. 3b is a cross-sectional side view of the exemplary layers of FIG. 3a after etching the SiO layer 310. The difference between FIG. 3b and FIG. 3a is in FIG. 3b structures or vias 318 are formed in the SiO layer 310 through etching by the disclosed oxygen and iodine-containing etching compounds. The SiO layer 310 may be etched with photoresist layer 312 as a mask layer. The mask layer may be any suitable photoresist mask materials, such as TiN, a-C and so on. The etching may be stopped at the underlying SiN layer 308.

The disclosed oxygen and iodine-containing etching compounds may also be used to etch the SiN layer 308 with different plasma conditions and different mixtures of etching compounds. One of ordinary skill in the art will recognize that the stack and geometry of layers in FIG. 3a and FIG. 3b are provided for exemplary purposes only and that the disclosed oxygen and iodine-containing etching compounds may be used to etch other types of stacks of layers. Furthermore, one of ordinary skill in the art will recognize that the number of layers in the stack may vary (i.e., may include more or less than the four layers depicted).

The vapor of the disclosed oxygen and iodine-containing etching compounds is introduced into the reaction chamber containing the substrate and silicon-containing films. The vapor may be introduced to the chamber at a flow rate ranging from approximately 0.1 sccm to approximately 1 slm. Here sccm is standard cubic centimeters per minute; and slm is standard liter per minute. For example, for a 200 mm wafer size, the vapor may be introduced to the chamber at a flow rate ranging from approximately 5 sccm to approximately 50 sccm. Alternatively, for a 450 mm wafer size, the vapor may be introduced to the chamber at a flow rate ranging from approximately 25 sccm to approximately 250 sccm. One of ordinary skill in the art will recognize that the flow rate may vary from tool to tool.

The disclosed oxygen and iodine-containing etching compounds may be supplied either in neat form or in a blend with an inert gas, such as $N_2$, Ar, Kr, Ne, He, Xe, etc., or solvent. The disclosed oxygen and iodine-containing etching compounds may be presented in varying concentrations in the blend. For liquid oxygen and iodine-containing etching compounds, the vapor form of the oxygen and iodine-containing etching compounds may be produced by vaporizing the neat or blended oxygen and iodine-containing etching compound solution through a conventional vaporization step such as direct vaporization or by bubbling. The neat or blended oxygen and iodine-containing etching compounds may be fed in liquid state to a vaporizer where it is vaporized before it is introduced into the reactor.

Alternatively, the neat or blended oxygen and iodine-containing etching compounds may be vaporized by passing a carrier gas into a container containing the disclosed oxygen and iodine-containing etching compounds or by bubbling the carrier gas into the disclosed oxygen and iodine-containing etching compounds. The carrier gas may include, but is not limited to, Ar, He, $N_2$, Kr, Xe, Ne and mixtures thereof. Bubbling with a carrier gas may also remove any dissolved oxygen present in the neat or blended iodine-containing etching compound solution. The carrier gas and disclosed oxygen and iodine-containing etching compounds are then introduced into the reactor as a vapor.

If necessary, the container containing the disclosed oxygen and iodine-containing etching compounds may be heated to a temperature that permits the oxygen and iodine-containing etching compounds to be in liquid phase and to have a sufficient vapor pressure for delivery into an etching tool. The container may be maintained at temperatures in the range of, for example, approximately 0° C. to approximately 150° C., preferably from approximately 25° C. to approximately 100° C., more preferably from approximately 25° C. to approximately 50° C. More preferably, the container is maintained at room temperature (approximately 25° C.) in order to avoid heating lines to the etch tool. Those skilled in the art recognize that the temperature of the container may be adjusted in a known manner to control the amount of oxygen and iodine-containing etching compound vaporized.

Additionally, the disclosed oxygen and iodine-containing etching compounds are delivered in purity ranging from 95% to 99.999% by volume and may be purified with known standard purification techniques for removal of CO, $CO_2$, $N_2$, $H_2O$, HF, $H_2S$, $SO_2$, halides, and other hydrocarbons or hydrohalocarbons.

An inert gas is also introduced into the reaction chamber in order to sustain the plasma. The inert gas may be He, Ar, Xe, Kr, Ne, $N_2$, or combinations thereof. The etching gas and the inert gas may be mixed prior to introduction to the chamber, with the inert gas comprising between approximately 0.01% v/v and approximately 99.9% v/v of the resulting mixture. Alternatively, the inert gas may be introduced to the chamber continuously while the etching gas is introduced to the chamber in pulses.

The vapor of the disclosed oxygen and iodine-containing etching compounds and inert gas are activated by plasma to produce an activated etching gas. The plasma decomposes the oxygen and iodine-containing etching compounds into radical form (i.e. the activated etching gas). The plasma may be generated by applying RF or DC power. The plasma may be generated with a RF power ranging from about 25 W to about 100,000 W. The plasma may be generated remotely or within the reactor itself. The plasma may be generated in dual CCP or ICP mode with RF applied at both electrodes. RF frequency of plasma may range from 100 KHz to 1 GHz. Different RF sources at different frequency may be coupled and applied at same electrode. Plasma RF pulsing may be further used to control molecule fragmentation and reaction at substrate. One of skill in the art will recognize methods and apparatus suitable for such plasma treatment.

A quadrupole mass spectrometer (QMS), optical emission spectrometer, FTIR, or other radical/lion measurement tools may measure the activated etching gas from the chamber exhaust to determine the types and numbers of species produced. If necessary, the flow rate of the etching gas and/or the inert gas may be adjusted to increase or decrease the number of radical species produced.

The vapor of the disclosed oxygen and iodine-containing etching compounds may be mixed with other gases either prior to introduction into the reaction chamber or inside the reaction chamber. Preferably, the gases may be mixed prior to introduction to the chamber in order to provide a uniform concentration of the entering gas.

In another alternative, the vapor of the oxygen and iodine-containing etching compound may be introduced into the chamber independently of the other gases, such as when two or more of the gases react or are easier to deliver independently.

In another alternative, the etching gas, i.e., the vapor of the oxygen and iodine-containing etching compound, and the inert gas are the only two gases that are used during the etching process.

Exemplary other gases include, without limitation, oxidizers such as $O_2$, $O_3$, CO, $CO_2$, NO, $N_2O$, $NO_2$, $H_2O$, $H_2O_2$, COS, $SO_2$ and combinations thereof. The disclosed oxygen and iodine-containing etching gases and the oxidizer may be mixed together prior to introduction into the reaction chamber.

Alternatively, the oxidizer may be introduced continuously into the chamber and the etching gas introduced into the chamber in pulses. The oxidizer may comprise between approximately 0.01% v/v to approximately 99.99% v/v of the mixture introduced into the chamber (with 99.99% v/v representing introduction of almost pure oxidizer for the continuous introduction alternative).

Other exemplary gases with which the disclosed oxygen and iodine-containing etching compounds may be used include additional etching gases, such as $cC_4F_8$, $C_4F_8$, $cC_5F_8$, $C_5F_8$, $C_4F_6$, $CF_4$, $CH_3F$, $CF_3H$, $CH_2F_2$, $C_3HF_7$, $C_3F_6$, $C_3H_2F_6$, $C_3H_2F_4$, $C_3H_3F_5$, $C_4HF_7$, $C_5HF_9$, $C_3F_6$, $C_3F_8$, $CF_3I$, $C_2F_3I$, $C_2F_5I$, $C_3F_{7I}$, 1-Iodoheptafluoropropane (1-$C_3F_7I$), 2-Iodoheptafluoropropane (2-$C_3F_7I$), $C_4F_9I$, $C_3HF_7$, COS, FNO, F—C≡N, $CS_2$, $SO_2$, $SF_6$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), and cis-1,1,2,2,3,4-hexafluorocyclobutane (cis-$C_4H_2F_6$) or combinations thereof. For example, approximately 1% v/v to approximately 25% v/v of the disclosed oxygen and iodine-containing etching compound may be used with a balance of $C_4F_6$ or $cC_4F_8$. As shown in the examples that follow, the combination of the disclosed oxygen and iodine-containing etching compounds with conventional etch gases may result in increased etch rates while maintaining the higher selectivity between the substrate and layer to be etched associated with the disclosed oxygen and iodine-containing etching compounds.

The vapor of the disclosed oxygen and iodine-containing etching compounds and the etching gas may be mixed prior to introduction to the reaction chamber. The additional etching gas may comprise between approximately 0.01% v/v to approximately 99.99% v/v of the mixture introduced into the chamber.

In one non-limiting exemplary plasma etch process, the vapor of a disclosed oxygen and iodine-containing compound, such as $C_4F_9IO$, is introduced into a 200 mm Dual CCP plasma etch tool using a controlled gas flow device. The controlled gas flow device may be a mass flow controller or a bubbler design with inert gas flow to deliver the vapor of the desired molecule. In case of high boiling point molecules, a special low pressure drop mass flow controller from Brooks Automation (No. GF120XSD), MKS Instruments, etc., may be used. The pressure of the reaction chamber is set at approximately 30 mTorr. No gas source heating may be necessary if the vapor pressure is sufficient. The distance between the two CCP electrodes is kept at 1.35 cm and the top electrode RF power is fixed at 750 W. The bottom electrode RF power is varied to analyze the performance of the molecule. The reaction chamber contains a substrate having silicon-containing films thereon, similar to those shown in FIG. 1a. The anti-reflective coating layer 108 is patterned/etched by a fluorocarbon (e.g., $CF_4$ and $CH_2F_2$) and oxygen-containing gas (e.g., $O_2$). The amorphous carbon mask layer 106 is patterned/etched by an oxygen-containing gas. The SiO and SiN layers 104 are patterned by the plasma of the disclosed oxygen and iodine-containing etching compounds (e.g., $C_4F_9IO$) and Argon. Argon is independently introduced into the chamber at a 250 sccm flow rate. $C_4F_9IO$ is independently introduced into the chamber at 15 sccm. $O_2$ is independently introduced into the chamber and varied from 0 sccm to 20 sccm to determine optimum etching conditions. An aperture having an aspect ratio equal to or greater than 10:1 is produced, preferably greater than 50:1 which may be used as a channel hole or contact hole or staircase etch, slit etch in 3D NAND and DRAM. Similar example may be used for other stack layers as shown in FIG. 2 and FIG. 3a.

In another non-limiting exemplary plasma etch process, $C_4F_9IO$ is introduced into a 200 mm Dual CCP plasma etch tool using a controlled gas flow device. The controlled gas flow device may be a mass flow controller. In case of high boiling point molecules, a special low pressure drop mass flow controller from Brooks Automation (No. GF120XSD), MKS Instruments, etc., may be used. The pressure of the reaction chamber is set at approximately 30 mTorr. No gas source heating may be necessary if the vapor pressure is sufficient. The distance between the two CCP electrodes is kept at 1.35 cm and the top electrode RF power is fixed at 750 W. The bottom electrode RF power is varied to analyze the performance of $C_4F_9IO$. The reaction chamber contains a substrate 100 having a thick SiO layer 104a thereon, similar to the layer shown in FIG. 2. Prior to this process, the antireflective coating layer 108 is removed by a fluorocarbon (e.g., $CF_4$) and oxygen-containing gas (e.g., $O_2$) and the a-C mask layer 106 is removed by an oxygen-containing gas. Argon is independently introduced into the chamber at a 250 sccm flow rate. $C_4F_9IO$ is independently introduced into the chamber at 15 sccm. $O_2$ is independently introduced into the chamber at 0-20 sccm to determine optimum etching conditions. An aperture having an aspect ratio equal to or greater than 10:1 is produced, which may be used as a contact hole in DRAM. Similar examples may be used for other stack layers as shown in FIGS. 1a and 3a.

The silicon-containing films and the activated oxygen and iodine-containing etching gas react to form volatile by-products that are removed from the reaction chamber. The a-C mask, antireflective coating, and photoresist layer are less reactive with the activated etching gas. Thus, the activated etching gas selectively reacts with the silicon-containing films to form volatile by-products.

The temperature and the pressure within the reaction chamber are held at conditions suitable for the silicon-containing film to react with the activated etching gas. For instance, the pressure in the chamber may be held between approximately 0.1 mTorr and approximately 1000 Torr, preferably between approximately 1 mTorr and approximately 10 Torr, more preferably between approximately 10 mTorr and approximately 1 Torr, and more preferably between approximately 10 mTorr and approximately 100 mTorr, as required by the etching parameters. Likewise, the substrate temperature in the chamber may range between about approximately −196° C. to approximately 500° C., preferably between approximately −120° C. to approximately 300° C., more preferably between approximately −100° C. to approximately 50° C.; and more preferably between approximately −10° C. to approximately 40° C. Chamber wall temperatures may range from approximately −196° C. to approximately 300° C. depending on the process requirements.

The reactions between the silicon-containing film and the activated etching gas result in anisotropic removal of the silicon-containing films from the substrate. Atoms of nitrogen, oxygen, and/or carbon may also be present in the silicon-containing film. The removal is due to a physical sputtering of silicon-containing film from plasma ions (accelerated by the plasma) and/or by chemical reaction of plasma species to convert Si to volatile species, such as $SiF_x$, wherein x ranges from 1-4.

The plasma activated vapor of the disclosed oxygen and iodine-containing etching compounds preferably exhibits high selectivity toward the mask and etches through the alternating layers of SiO and SiN resulting in a vertical etch profile with no bowing or roughness, which is important for 3D NAND applications. Additionally, plasma activated vapor deposits polymer on sidewall to minimize feature profile deformation. For other applications, such as DRAM and 2D NAND, for example, the plasma activated etching gas under different process conditions may selectively etch SiO from SiN. The plasma activated etching gas may selectively etch SiO and/or SiN from mask layers, such as a-C, photoresist, p-Si, or silicon carbide; or from metal contact layers, such as Cu, W, Ru, etc.; or from channel regions consisting of SiGe or polysilicon regions.

The disclosed etch processes using the disclosed oxygen and iodine-containing etching compounds as the etching gases produce channel holes, gate trenches, staircase contacts, capacitor holes, contact holes, contact etch, slit etch, self-aligned contact, self-aligned vias, super vias etc., in the silicon-containing films. The resulting aperture may have an aspect ratio ranging from approximately 10:1 to approximately 200:1 and a diameter ranging from approximately 5 nm to approximately 500 nm, preferably less than 100 nm. For example, one of ordinary skill in the art will recognize that a channel hole etch produces apertures in the silicon-containing films having an aspect ratio greater than 50:1.

Typical materials that need to be etched may be SiO. A process of etching SiO may be relevant to etching trenches in borophosphosilicateglass (BPSG), tetraethylorthosilicate (TEOS), or low deposition rate TEOS (LDTEOS), thermal oxide made through a wet or dry process. An etch stop layer may be silicon nitride or silicon oxygen nitride (SiON) or poly silicon. A mask material used may be a-C, p-Si, or photo resist materials. Herein, the disclosed oxygen and iodine-containing etching compounds are applied to etch SiO, SiN, p-Si and/or a-C substrate films.

As shown in the examples that follow, evaluations of dry etching of SiO, SiN, p-Si and a-C films with the disclosed oxygen and iodine-containing etching compounds show that the oxygen and iodine-containing HFCs yield highest selectivity of silicon oxide versus amorphous carbon, silicon nitride and p-Si than the prior art fluorocarbons. The reason for high selectivity may be attributed to the formation of low F/C iodine containing fragments during plasma dissociation of the etch gases, which results in the formation of a protective polymer film on the substrates. Additionally, the iodine is ionized and bombards the surface with the heavy iodine ion similar to inert gases such as Ar, Kr, and Xe. Also the iodine ionized atoms modifies the surface of the organic hard mask, by doping it to improve the etch resistance of the organic hard mask, so as to favor high aspect ratio etch. The activated oxygen and iodine-containing etching compound produces iodine ions, which strengthens the patterned mask layer, thereby reinforcing and minimizing damage to a patterned mask layer while forming a patterned structure in the substrate. The etching gas results presented herein show they are not only ready for patterned structure etch process, such as contact etch process, but also may be beneficial for other etching processes on silicon or metal containing substrates, including low k etching processes. In addition, in the process of forming the patterned structure by etching with the disclosed oxygen and iodine-containing etching compound, an etch resistance of the pattern mask layer may be increased by doping iodine to the surface of the pattern mask layer, thereby modifying the surface. In this case, the iodine ions from the activated oxygen and iodine-containing etching compound are implanted into the patterned mask layer (i.e., the surface and/or the body/bulk of the patterned mask layer) while etching the silicon-containing film from the substrate to form the patterned structure. Besides, the disclosed oxygen and iodine-containing etching compounds are suitable for reduction of the global warming potential caused by perfluorocarbon compounds.

By tuning the process parameters and depending on applications doping concentration of Iodine may be increase from 0.1 to 99.9% through the deposited film.

An iodine atomic concentration in the substrate material ranging from approximately 0.1% to approximately 99.9% with a uniform concentration through the deposited film.

An iodine atomic concentration in the substrate material ranging from approximately 1% to approximately 50% with a uniform concentration through the deposited film.

An iodine atomic concentration in the substrate material ranging from approximately 2% to approximately 30% with a uniform concentration through the deposited film.

Furthermore, oxygen in the activated oxygen and iodine-containing etching compound may be doped into the a-C mask layer. Oxygen in the activated oxygen and iodine-containing etching compound may also reduce the use of an oxidizer or eliminate the use of the oxidizer. In some embodiments, an oxidizer may not be introduced. In some embodiments, little oxidizer may be used. As stated above, the oxidizer removes the deposited polymer but may make the etched structure deformed. With the disclosed oxygen and iodine-containing etching compounds, less to no oxidizer may be applied, so that the etched structure will keep a straight profile. In addition, the oxygen in the activated oxygen and iodine-containing etching compound helps incorporating greater amount of iodine-containing ions, radicals and species into the mask layer, such as the carbon-containing layer. In addition, the oxygen in the activated oxygen and iodine-containing etching compound helps increasing the etch rate of a silicon-containing layer.

EXAMPLES

The following non-limiting examples are provided to further illustrate embodiments of the invention. However, the examples are not intended to be all inclusive and are not intended to limit the scope of the inventions described herein.

In the following examples, experiments were carried out with commercial LAM tool 4520XLe 200 mm (CCP dual frequency plasma) or alternatively with commercial AMEC 300 mm Primo SSC HD-RIE etcher. Planar wafers were purchased from Advantive Tech. Planar wafers tested are four different substrates below.

Experiment was carried out at the Air Liquide R&D Innovation Campus Delaware with commercial LAM tool 4520XLe (CCP dual frequency plasma with 10 gas lines). Planar wafers were purchased from Advantive Tech. Planar wafers tested are:

2 um PECVD TEOS on Si substrate,
2 um PECVD $Si_3N_4$ on Si substrate,
300 nm LP-CVD poly-Si on Si substrate,
350 nm PE-CVD a-C on Si substrate.

For planar test: etch rate and selectivity were evaluated through ellipsometry and SEM at different $O_2$ flow rate by measuring the change in etch thickness as a function of etching time. The gas flow rate of process testing molecules is maintaining constant at 15 sccm and of Ar flow rate at 250 sccm, while screening $O_2$ flow rate from 0-20 sccm. Subsequently, polymer composition was studied by X-Ray Photoelectron Spectroscopy.

The etching experiment were performed on four 1.5 x1.5 $cm^2$ planar coupons having four different substrate materials including $SiO_2$, $Si_3N_4$, p-Si and a-C. The coupons are placed on 200 mm diameter carrier wafer and held in contact by using silicon oil or thermal paste. Alternatively, double sided carbon tape obtained from SPI supplies may have been used to stick coupons on carrier wafer.

Etching tests were performed at a pressure of 30 mTorr, source power of 750 W (27 MHz), bias power of 1500 W (2 MHz), and temperature 20° C. The feed mixture contains 250 sccm of Ar, 15 sccm of etch gas, while 02 is varied in the range 0 to 20 sccm.

To prove the repeatability, each etching test have been repeated at least three times. Standard deviation of the average of the three measurements is shown as error bar in the chart. Subsequently, polymer composition was studied by X-Ray Photoelectron Spectroscopy (XPS).

Example 1 Plasma Enhanced Dry Etching Using $C_3F_7IO$

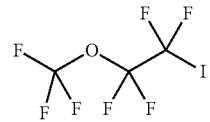 [SMILES: FC(F)(F)OC(F)(F)C(F)(F)I]

$C_3F_7IO$, 2-Iodo-1,1,2,2-tetrafluoro-1-(trifluoromethoxy) ethane was applied to plasma etch silicon oxide $SiO_2$.

TABLE 3

| Molecule name | Boiling point | CAS | Purity | Supplier |
| --- | --- | --- | --- | --- |
| $C_3F_7IO$ | 47.5° C. | 1561-52-0 | 97.0% | Synquest |

Figure 4:
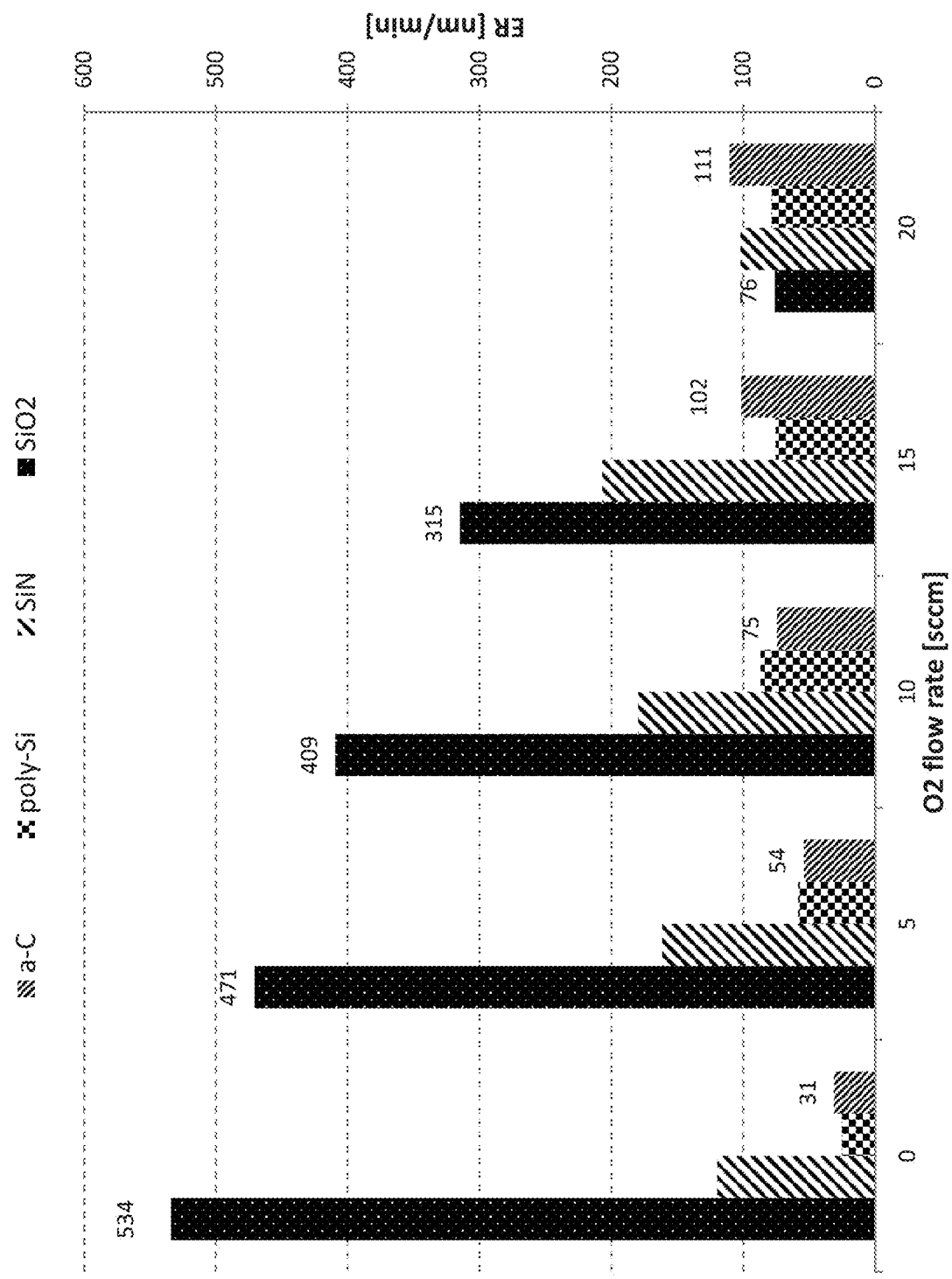
FIG. 4 is etch rates (ER) and selectivity of $C_3F_7IO$ on four different substrates.
Figure 8:
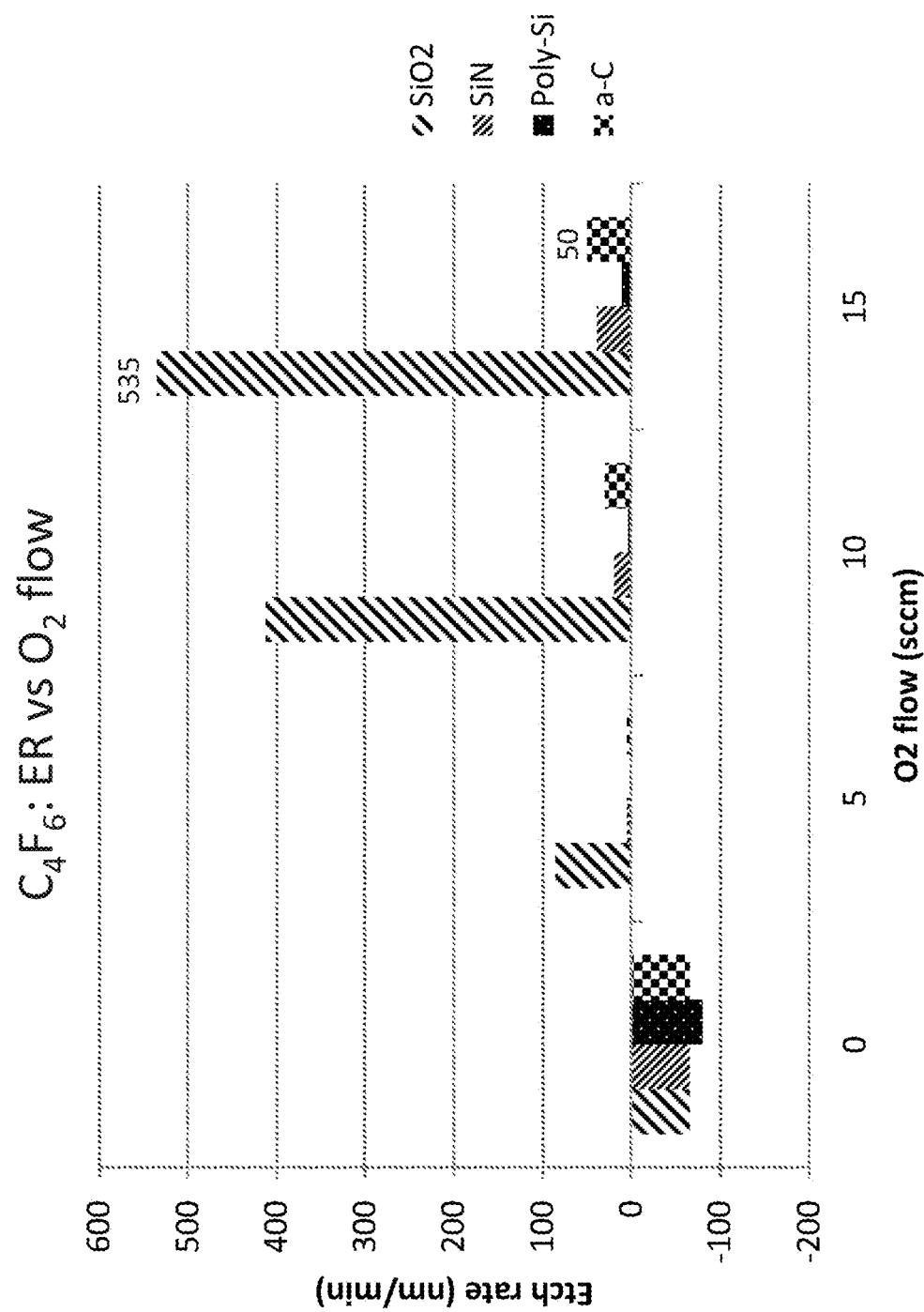
FIG. 8 is etch rates (ER) and selectivity of $C_4F_6$ on four different substrates vs. the oxygen flow.

FIG. 4 shows etch rates (ER) and selectivity of $C_3F_7IO$ on four different substrates, i.e., SiO, SiN, p-Si, a-C, at different $O_2$ flow rate (0-20 sccm). The ERs of $SiO_2$ and a-C are inversely proportional: as $O_2$ flow rate decreases, the ER of $SiO_2$ increases; as the ER of a-C decreases, it is shown that the highest $SiO_2$/a-C selectivity is ~17:1 and the $SiO_2$ ER is ~535 nm min at $O_2$=0 sccm. Table 4 is a comparison with benchmark standard etch gas $C_4F_6$, commonly used in the industry. $C_3F_7IO$ shows approximately 70% higher $SiO_2$/a-C selectivity than that of benchmark gas ($C_4F_6$) with similar etch rates. To be notice is the number of carbons in the two molecules ($C_3$ vs $C_4$) and the difference in F/C ration into the two etch compounds: $C_3F_7IO$ has an F/C ratio=2.33 and $C_4F_6$ has a F/C ratio=1.5. Generally, from literature higher F/C ration shows lower selectivity due to the lower number of carbon that make the polymer and preserve the pattern mask. However, $C_3F_7IO$ even having a lower number of carbon shows higher selectivity due to the presence of iodine- and oxygen-containing elements in the etch compound. FIG. 8 is a graph demonstrating etch rates of SiO, SiN, p-Si and a-C using $C_4F_6$.

TABLE 4

| | $SiO_2$ ER [nm/min] | $SiO_2$/a-C selectivity |
|---|---|---|
| $C_3F_7IO$ | 535 | 17 |
| $C_4F_6$ | 535 | 10.7 |

XPS data analysis: In order to simulate the polymer layer formation occurring on the top surface and on the sidewall during plasma etch processing, the process conditions were tuned: a-C and Si bare coupons were etched at 30 mTorr for 60 sec, source power of 750 W (27 MHz), with no bias power (0 W, 2 MHz) at the substrate. The process feed the mixture contains 125 sccm of Ar, 30 sccm of $C_3F_7IO$ and no $O_2$, listed in Table 5. Because of the absence of the bias power, the ions reaching the substrate may not have sufficient energy to etch the substrate. In addition, the neutrals and the active species reaching to the surface of the substrate stick to the surface, based on their sticking coefficient, so that deposit a thin polymer layer thereon. This thin polymer layer may be responsible for sidewall passivation and often provides the selectivity.

TABLE 5

| Source power | Bias power | Pressure | Time | $C_3F_7IO$ flow rate | Ar flow rate | $O_2$ flow rate |
|---|---|---|---|---|---|---|
| 750 W | 0 W | 30 mTorr | 60 s | 30 sccm | 125 sccm | 0 sccm |

Figure 5A:
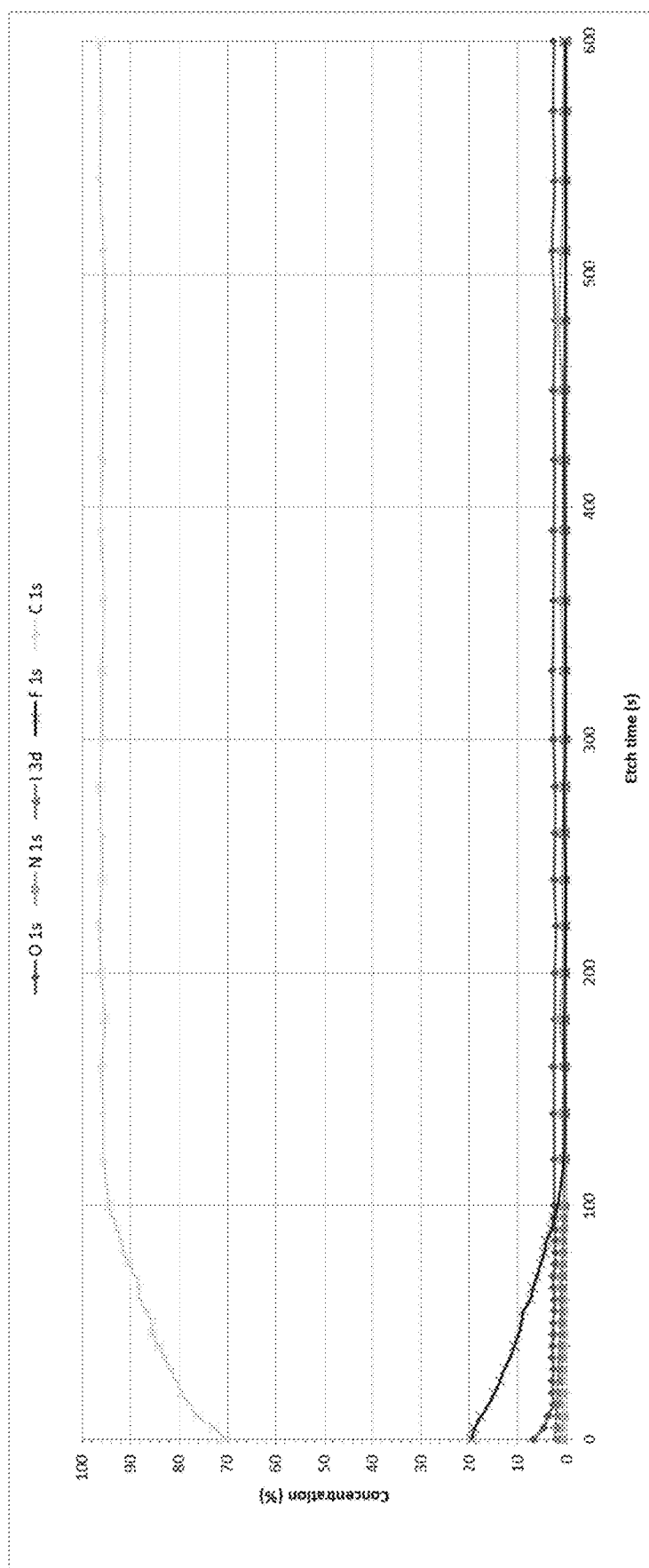
FIG. 5a is the X-ray photoelectron spectroscopy (XPS) depth profile showing the atomic concentration (%) vs Ar etch time of an amorphous carbon pattern masks etched by $C_3F_7IO$.
Figure 5B:
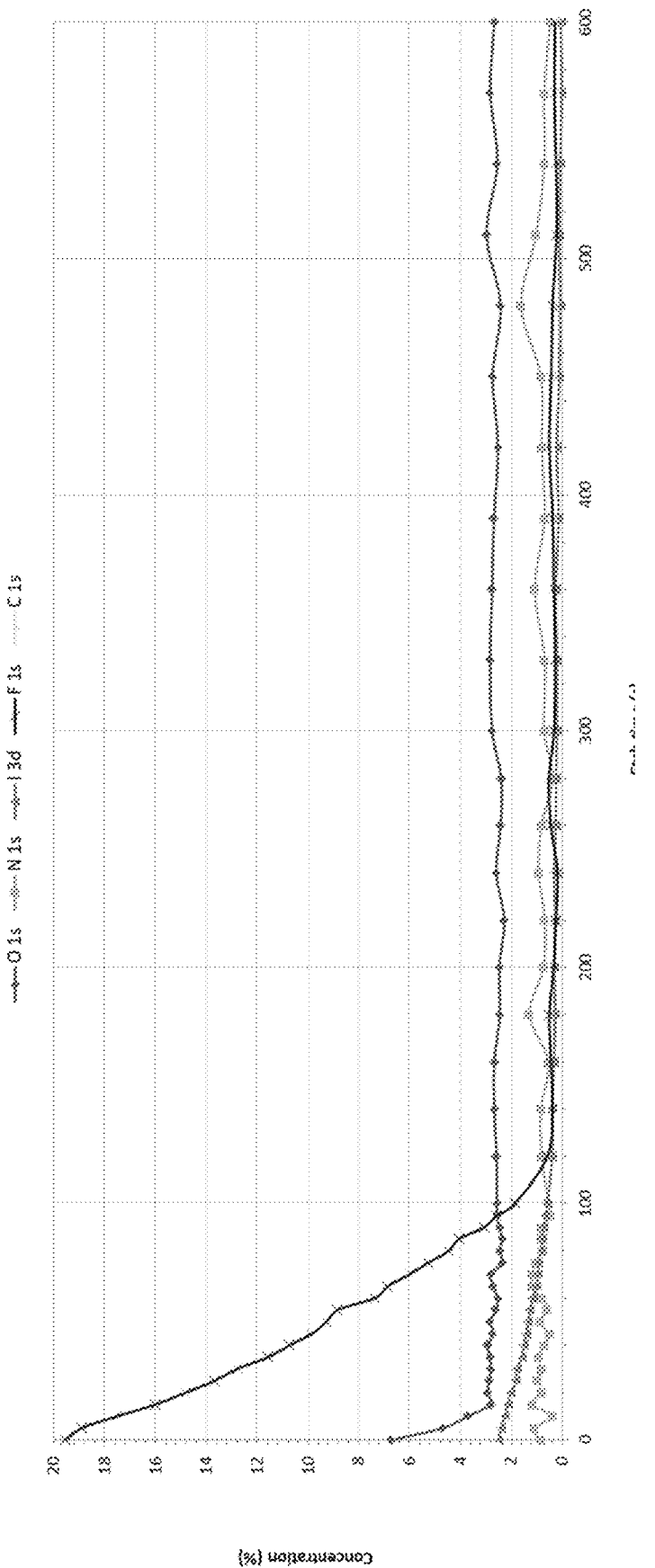
FIG. 5b is zoom in the X-ray photoelectron spectroscopy (XPS) depth profile showing the atomic concentration (%) vs Ar etch time of an amorphous carbon pattern masks etched by $C_3F_7IO$, highlighting the Iodine and Oxygen doping of the mask.
Figure 6A:
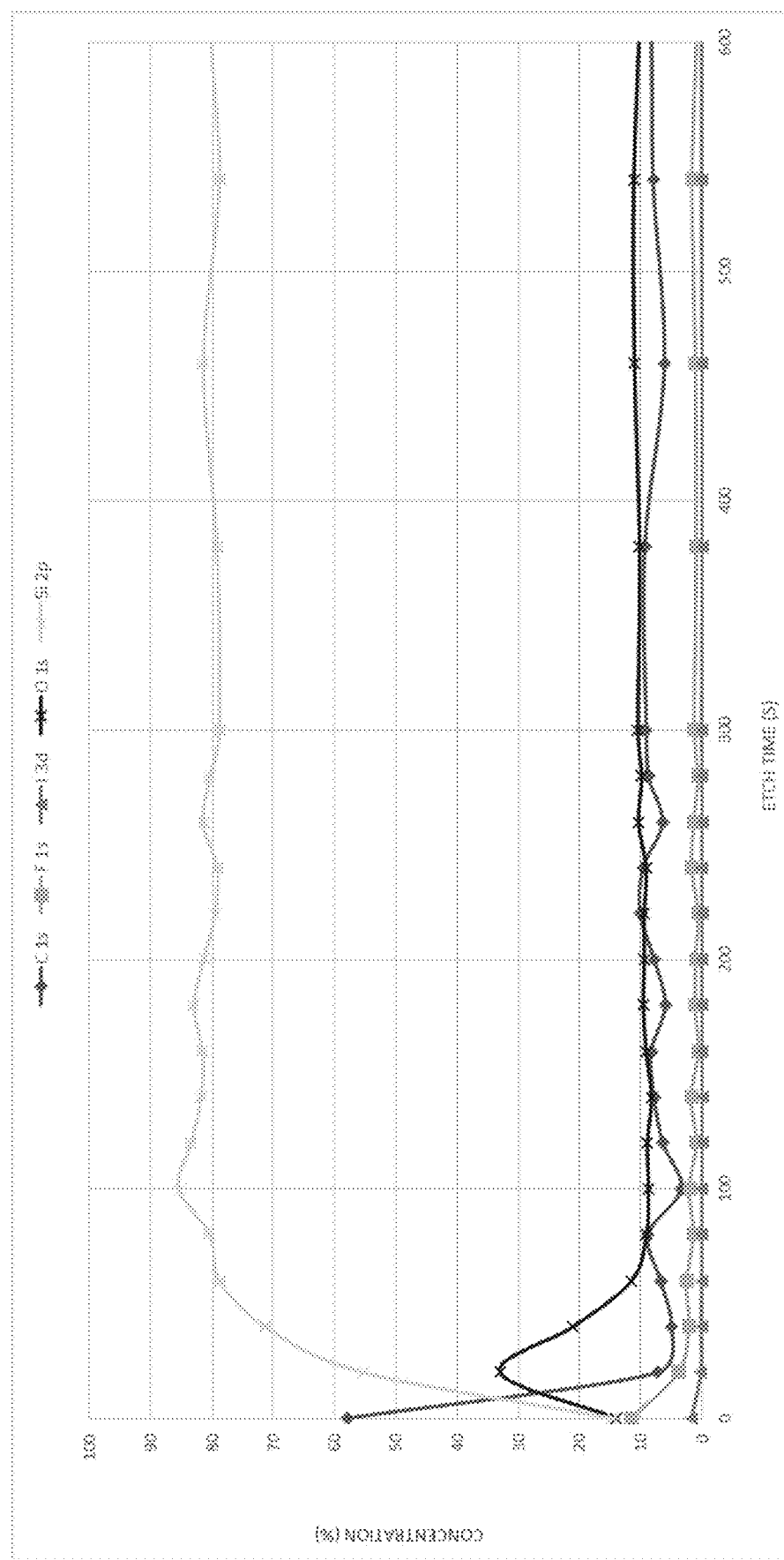
FIG. 6a is the X-ray photoelectron spectroscopy (XPS) depth profile showing the atomic concentration (%) vs Ar etch time of silicon substrate etched by $C_3F_7IO$.
Figure 6B:
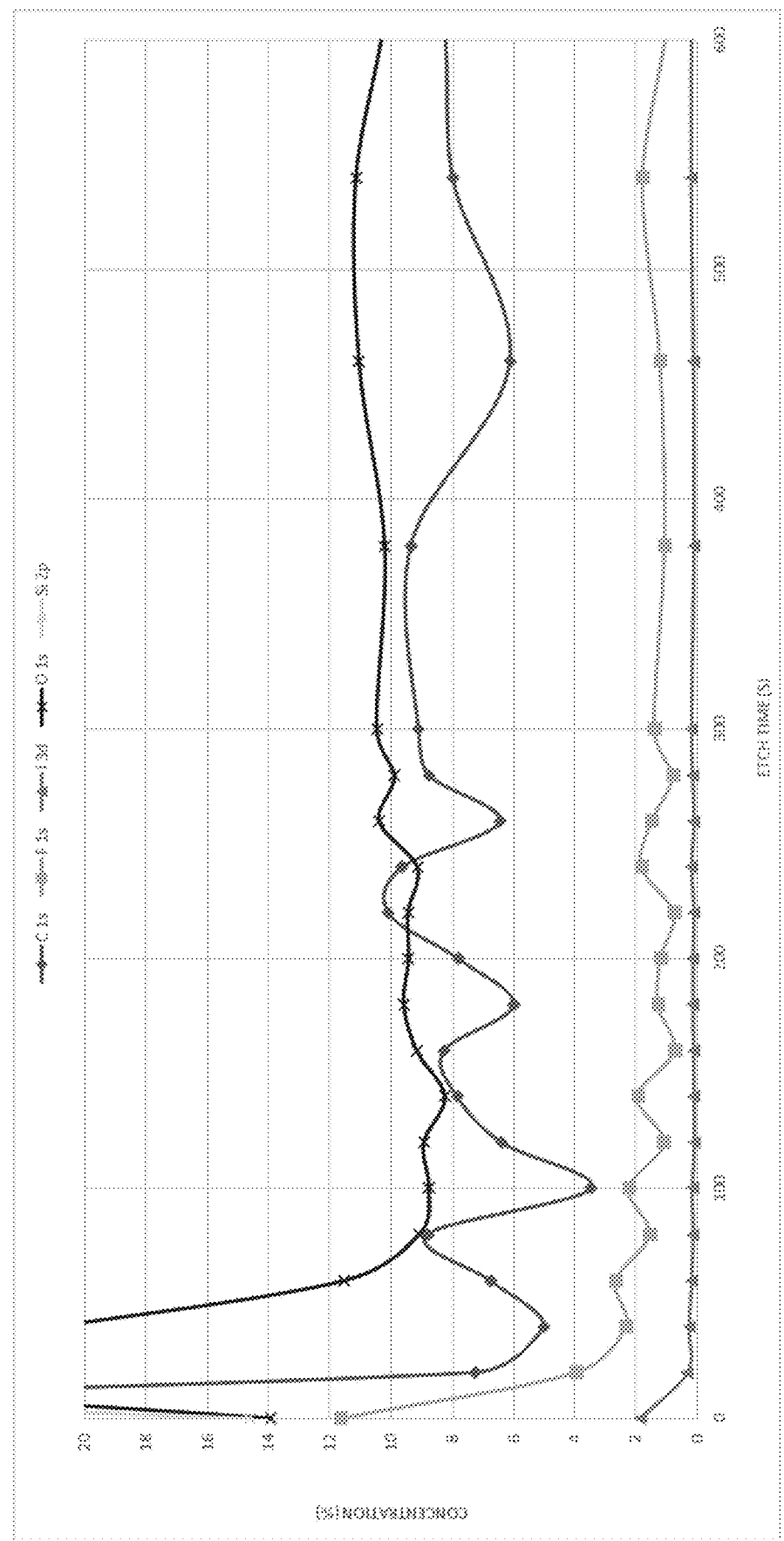
FIG. 6b is zoom in the X-ray photoelectron spectroscopy (XPS) depth profile showing the atomic concentration (%) vs Ar etch time of silicon substrate etched by $C_3F_7IO$, highlighting the Oxygen doping of the mask.

For XPS depth profile, large cluster ion gas Ar1000+ at 5 keV ion energy have been used, instead of monoatomic Ar+ in order to minimize the chemical damage and avoid potential knock-on of iodine atoms during Ar sputtering, which is likely to happen during organic material sputtering, such as fluorocarbon polymer or amorphous carbon. FIG. 5a shows a depth profile on a-C substrate. FIG. 5b shows a zoom in figure of FIG. 3a without showing C1s. Table 6 lists the XPS results of using $C_3F_7IO$ to etch a carbon-containing substrate.

TABLE 6

| C1s | F1s | O1s | I3d | N1s |
|---|---|---|---|---|
| 70.5 | 19.5 | 6.7 | 2.5 | 0.8 |

TABLE 7

| Si 2p | C1s | F1s | O1s | I3d |
|---|---|---|---|---|
| 14.7 | 57.9 | 11.6 | 13.9 | 1.9 |

Oxygen and Iodine-containing fluorocarbon compound shows an interesting behavior during the carbon-containing mask etch compared to Si-containing materials. According to XPS data, Iodine modifies the carbon surface and penetrates deeply on a-C mask, similar to a doping effect and helping preserve the hardmask layer during etch. Table 7 lists the XPS results of using $C_3F_7IO$ to etch a silicon-containing substrate. On the Si substrate, a thin polymer layer with the following structure $C_xF_yI_zO_k$ is observed superficially, but iodine content drop to zero after about 20 sec etch time, while on the a-C layer, iodine can be seen deeper, in low percentage (<2%). Also oxygen coming from $C_3F_7IO$ gets incorporated in the bulk of the a-C mask layer with a concertation of 2-3%. By tuning the process parameters and depending on the applications doping concentration of Iodine may be increase from 0.1 to 99.9% through the deposited film.

Figure 7:
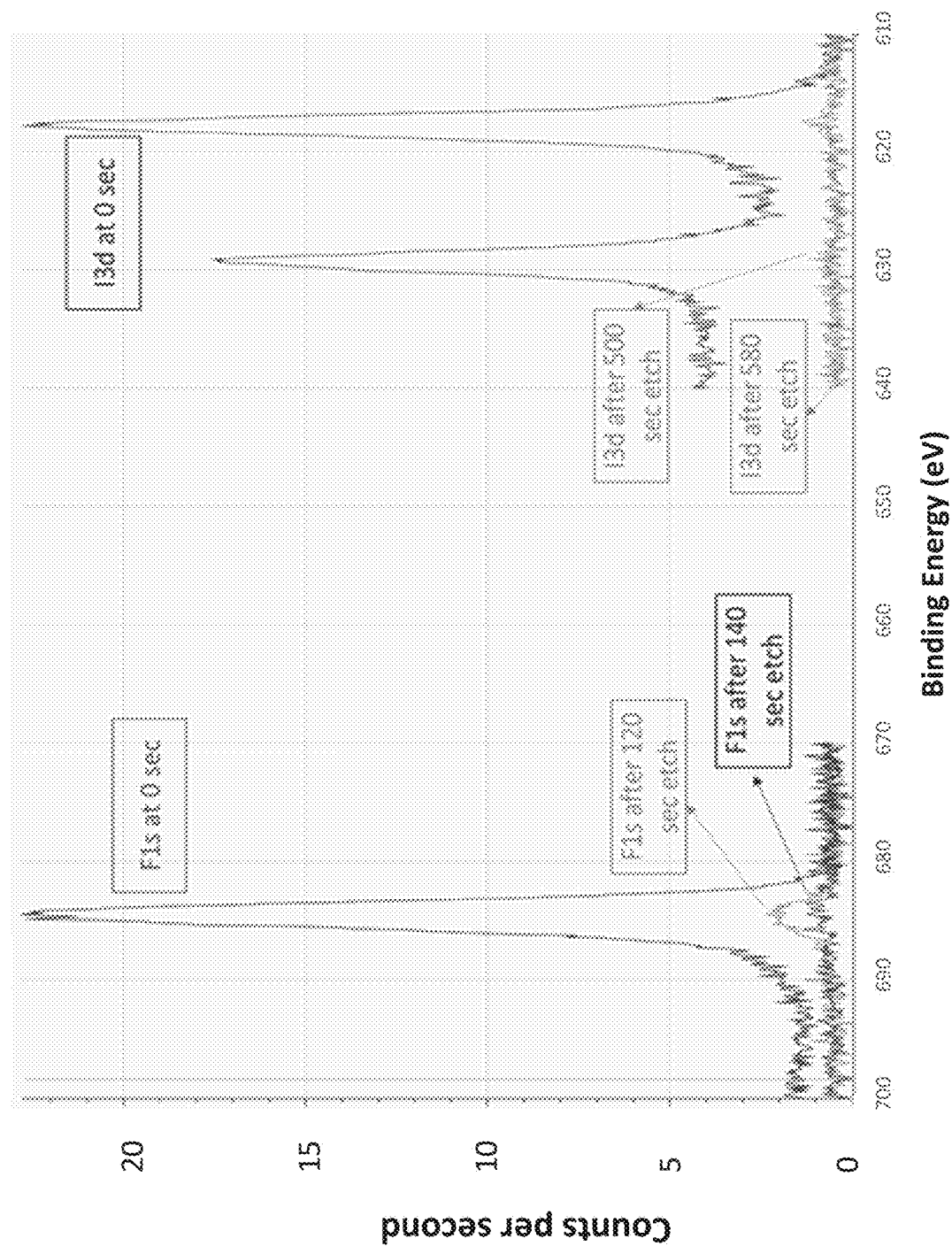
FIG. 7 is the X-ray photoelectron spectroscopy (XPS) showing the counts per second vs binding energy (eV) of the Fluorine (F1s) peak vs Iodine 13d peak of an amorphous carbon pattern masks etched by $C_3F_7IO$.

Comparing the F1s and I3d peaks during XPS shown in Table 5, depth profile on the a-C substrate (in FIG. 7, the y-axis are shown the counts per second and the x-axis the binding energy (eV)):

fluorine deposits superficially forming a thin IFC (iodo-fluorocarbon) polymer (F1s up to 120 sec Ar etch), iodine penetrates deeper in the a-C mask (I3d up to 500 sec etch).

Thus, iodine and oxygen species and helps preserve the a-C mask while etching, by modifying the surface and doping iodine into the a-C layer. Also, iodine helps minimize the damage by strengthening the a-C mask. In addition, the oxygen-containing species help retain and incorporating higher percentage of iodine in the pattern mask increasing the etch resistance of the pattern mask.

To prove the repeatability, each etching test have been repeated three times. Standard deviation of the average of the three measurements is shown as error bar in FIG. 4. Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method for forming a patterned structure, the method comprising the steps of:

a) introducing a vapor of an oxygen and iodine-containing etching compound into a reaction chamber that contains a substrate, the substrate having a silicon-containing film deposited thereon and a patterned mask layer deposited on the silicon-containing layer, wherein the oxygen and iodine-containing etching compound has the formula $C_nH_xF_yI_zO_e$, wherein $3 \leq n \leq 10$, $0 \leq x \leq 21$, $0 \leq y \leq 21$, $1 \leq z \leq 4$ and $1 \leq e \leq 2$;

b) activating a plasma to produce an activated oxygen and iodine-containing etching compound; and c) allowing an etching reaction to proceed between the activated oxygen and iodine-containing etching compound and the silicon-containing film to selectively etch the silicon-containing film from the patterned mask layer, thereby forming the patterned structure.

2. The method of claim 1, wherein the step c) comprising the step of:

modifying the patterned mask layer or doping iodine from iodine ions produced from the activated oxygen and iodine-containing etching compound into the patterned mask layer.

3. The method of claim 1, further comprising the step of introducing an inert gas into the reaction chamber, wherein the inert gas is selected from the group consisting of He, Ar, Xe, Kr, Ne and $N_2$.

4. The method of claim 1, further optionally comprising the step of introducing an oxidizer into the reaction chamber, wherein the oxidizer is selected from $O_2$, $O_3$, CO, $CO_2$, NO, $N_2O$, $NO_2$, $H_2O$, $H_2O_2$, COS, $SO_2$ and combinations thereof.

5. The method of claim 1, wherein the oxygen and iodine-containing etching compound is $C_3F_7IO$ and its isomers.

6. The method of claim 1, wherein the silicon-containing film comprises a layer of silicon oxide (SiO), silicon nitride (SiN), crystalline Si, poly-silicon (p-Si), polycrystalline silicon, amorphous silicon, low-k SiCOH, SiOCN, SiC, SiON, $Si_aO_bH_cC_dN_e$, where $a>0$; b, c, d and $e \geq 0$, alternating SiO and SiN (ONON) layers, or alternating SiO and p-Si (OPOP) layers.

7. The method of claim 6, wherein the oxygen and iodine-containing etching compound plasma etches the alternating SiO and SiN (ONON) layers having a selectivity between approximately 1:2 to approximately 2:1 with respect to the SiO layer versus SiN layer.

8. The method of claim 6, wherein the oxygen and iodine-containing etching compound plasma etches the alternating SiO and SiN (ONON) layers having a selectivity of approximately 1:1 with respect to the SiO layer versus SiN layer.

9. The method of claim 6, wherein the oxygen and iodine-containing etching compound plasma etches the alternating SiO and p-Si (OPOP) layers having a selectivity between approximately 1:2 to approximately 2:1 with respect to the SiO layer versus p-Si layer.

10. The method of claim 6, wherein the oxygen and iodine-containing etching compound plasma etches the alternating SiO and p-Si (OPOP) layers having a selectivity of approximately 1:1 with respect to the SiO layer versus p-Si layer.

11. The method of claim 1, wherein a selectivity of the oxygen and iodine-containing etching compound plasma etching $SiO_2$ over the patterned mask layer is approximately 70% higher than the selectivity of a benchmark gas $C_4F_6$ etching $SiO_2$ over the patterned mask layer with similar etch rates.

12. The method of claim 1, wherein the patterned mask layer is a carbon-containing layer, an amorphous carbon layer, a doped amorphous carbon layer, a photoresist layer, an anti-reflective layer, an organic planarization layer, or combinations thereof.

13. The method of claim 1, wherein the activated oxygen and iodine-containing etching compound selectively etches the silicon-containing film from a landing layer located at the bottom of the silicon-containing film to be etched.

14. The method of claim 13, wherein the landing layer is selected from:

a) W, Cu, Al, Ru, Pt, Ti, Ta, Ni, Co, Mo, Mn, Nb, Cr, Rh, Pd, Ir, V, Au, Ag, or combinations thereof;

b) AlO, WO, HfO, TiO, TaO, InO, WO, CrO, RuO, CoO, MoO, ZrO, SnO, or combinations thereof; and c) TiN, TaN, HfN, AlN, WN, MoN, NiN, NbN, CrN, RuN, CoN, ZrN, SrN or combinations thereof.

15. The method of claim 1, further comprising introducing an additional etch gas into the reaction chamber, wherein the additional etch gas is selected from the group consisting of $cC_4F_8$, $C_4F_8$, $cC_5F_8$, $C_5F_8$, $C_4F_6$, $CF_4$, $CH_3F$, $CF_3H$, $CH_2F_2$, $C_3HF_7$, $C_3F_6$, $C_3H_2F_6$, $C_3H_2F_4$, $C_3H_3F_5$, $C_4HF7$, $C_5HF9$, $C_3F_6$, $CsF_8$, $CF_3I$, $C_2F_3I$, $C_2F_5I$, $C_3F_7I$, 1-Iodoheptafluoropropane (1-$C_3F_7I$), 2-Iodoheptafluoropropane (2-$CsF_7I$), $C_4F9I$, $C_3HF_7$, COS, FNO, F—C≡N, $CS_2$, $SO_2$, $SF_6$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), and cis-1,1,2,2,3,4-hexafluorocyclobutane (cis-$C_4H_2F_6$), or combinations thereof.

16. The method of claim 1, wherein the patterned structure formed in the silicon-containing film has an aspect ratio between approximately 1:1 and approximately 200:1.

17. A method for forming a patterned structure, the method comprising the steps of:

a) introducing a vapor of $C_3F_7IO$ into a reaction chamber that contains a substrate, the substrate having a silicon-containing film deposited thereon and the patterned mask layer deposited on the silicon-containing layer;

b) activating a plasma to produce an activated $C_3F_7IO$; and c) allowing an etching reaction to proceed between the activated $C_3F_7IO$ and the silicon-containing film to selectively etch the silicon-containing film from the patterned mask layer, thereby forming the patterned structure.

18. The method of claim 17, wherein the step c) comprising the step of:

modifying the patterned mask layer by doping iodine from iodine ions produced from the activated $C_3F_7IO$ into the patterned mask layer.

19. A method of modifying the surface of a substrate, the method comprising:

introducing a vapor of an oxygen and iodine-containing etching compound into a reaction chamber that contains the substrate, the substrate having a silicon-containing film deposited thereon and the patterned mask layer deposited on the silicon-containing layer, wherein the oxygen and iodine-containing etching compound has the formula $C_nH_xF_yI_zO_e$, wherein $3 \leq n \leq 10$, $0 \leq x \leq 21$, $0 \leq y \leq 21$, $1 \leq z \leq 4$ and $1 \leq e \leq 2$; and etching the silicon-containing film from the patterned mask layer to form a patterned structure using an activated oxygen and iodine-containing etching compound formed by activating a plasma, wherein iodine from iodine ions produced from the activated oxygen and iodine-containing etching compound are doped into the patterned hardmask layer while forming the patterned structure in the substrate, thereby strengthening the patterned mask layer and minimizing damage of the patterned mask.

20. The method of claim 19, wherein the oxygen and iodine-containing etching compound is $C_3F_7IO$ and its isomers.

* * * * *